(12) United States Patent
Yamate

(10) Patent No.: US 8,247,264 B2
(45) Date of Patent: Aug. 21, 2012

(54) TRANSISTOR, METHOD FOR MANUFACTURING SAME, AND SEMICONDUCTOR DEVICE COMPRISING SUCH TRANSISTOR

(75) Inventor: Shinichi Yamate, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 754 days.

(21) Appl. No.: 12/065,004

(22) PCT Filed: Aug. 30, 2006

(86) PCT No.: PCT/JP2006/317133
§ 371 (c)(1),
(2), (4) Date: Feb. 27, 2008

(87) PCT Pub. No.: WO2007/026781
PCT Pub. Date: Mar. 8, 2007

(65) Prior Publication Data
US 2009/0267055 A1    Oct. 29, 2009

(30) Foreign Application Priority Data
Aug. 31, 2005  (JP) ................ 2005-251592

(51) Int. Cl.
*H01L 51/40* (2006.01)
(52) U.S. Cl. ..... 438/99; 438/197; 257/40; 257/E51.006; 257/E21.409
(58) Field of Classification Search ............ 257/40, 257/288, E51.006, E29.255, E21.09, E21.409; 438/99, 197
See application file for complete search history.

(56) References Cited

U.S. PATENT DOCUMENTS

| | | | |
|---|---|---|---|
| 4,913,867 A * | 4/1990 | Epstein et al. | 264/104 |
| 5,546,889 A | 8/1996 | Wakita et al. | |
| 5,928,801 A * | 7/1999 | Broer et al. | 428/690 |
| 6,107,117 A | 8/2000 | Bao et al. | |
| 6,661,024 B1 * | 12/2003 | Zhang et al. | 257/40 |
| 7,087,269 B2 * | 8/2006 | Lee et al. | 427/532 |
| 7,535,019 B1 * | 5/2009 | Sager et al. | 257/43 |
| 2002/0081275 A1 * | 6/2002 | Han | 424/78.08 |
| 2005/0224787 A1 | 10/2005 | Clemens | |
| 2006/0090650 A1 * | 5/2006 | Yamakawa et al. | 96/11 |

(Continued)

FOREIGN PATENT DOCUMENTS
EP    1 679 752 A1    7/2006
(Continued)

OTHER PUBLICATIONS

"Technologies for Enhancing Operation of Organic Transistors", Technical Information Institute Co., Ltd., (2003), pp. 1-332.

(Continued)

*Primary Examiner* — Matthew Landau
*Assistant Examiner* — Colleen E Snow
(74) *Attorney, Agent, or Firm* — Sughrue Mion, PLLC

(57) ABSTRACT

The invention provides a process for production of a transistor that can form an oriented active layer by a convenient method while yielding a transistor with excellent carrier mobility. The process according to the invention is a process for production of a transistor with an active layer composed of an organic semiconductor compound-containing semiconductor film, the process comprising
  a step of stretching the semiconductor film and
  a step of pasting the semiconductor film onto the side on which the active layer is to be formed while heating and/or pressing, to obtain the active layer.

5 Claims, 18 Drawing Sheets

U.S. PATENT DOCUMENTS

2009/0081914 A1* 3/2009 Yu et al. .................. 445/24

FOREIGN PATENT DOCUMENTS

| JP | 7-206599 A | 8/1995 |
| JP | 07-206599 A | 8/1995 |
| JP | 07-221367 A | 8/1995 |
| JP | 2004-146430 A | 5/2004 |
| JP | 2004-356422 A | 12/2004 |
| JP | 2005-101520 A | 4/2005 |
| JP | 2005-109028 A | 4/2005 |
| WO | 03/007399 A2 | 1/2003 |
| WO | 03/107450 A1 | 12/2003 |
| WO | 2005/043639 A1 | 5/2005 |

OTHER PUBLICATIONS

H. Sirringhaus et al., "Mobility enhancement in conjugated polymer field-effect transistors through chain alignment in a liquid-crystalline phase", Applied Physics Letters, vol. 77, No. 3, (Jul. 17, 2000), pp. 406-408.

M.L. Swiggers et al., "Orientation of pentacene films using surface alignment layers and its influence on thin-film transistor characteristics", Applied Physics Letters, vol. 79, No. 9, (Aug. 27, 2001), pp. 1300-1302.

S. Matsumoto et al., "Liquid Crystal Fundamentals and Applications", Kogyo Chosakai Publishing, (1991), pp. 95-105.

A. Fukuda et al., "Structures and Properties of Ferroelectric Liquid Crystals", Corona Publishing, (1990), pp. 227-269.

"Liquid Crystal", vol. 3, No. 1, (1999), pp. 3-16.

S.R. Wasserman et al., "Structure and Reactivity of Alkylsiloxane Monolayers Formed by Reaction of Alkyltrichlorosilanes on Silicon Substrates", Langmuir, vol. 5, (1989), pp. 1074-1079.

P. Dyreklev et al., "Aligned Polymer Chain Field Effect Transistors", Solid State Communications, vol. 82, No. 5, (1992), pp. 317-320.

P. Dyreklev et al., "Polymeric Field Effect Transistors Using Oriented Polymers", Synthetic Metals, 55-57, (1993), pp. 4093-4098.

Shoichi Ishihara; How Far Has the Molecular Alignment of Liquid Crystals Been Elucidated; IEEE/OSA Journal of Display Technology, vol. 1 No. 1, Sep. 2005 pp. 30-p40.

Dyreklev et al., Aligned Polymer Chain Field Effect Transistors; Solid State Communications; vol. 82, No. 5, pp. 317-320, 1992.

* cited by examiner

Fig.9
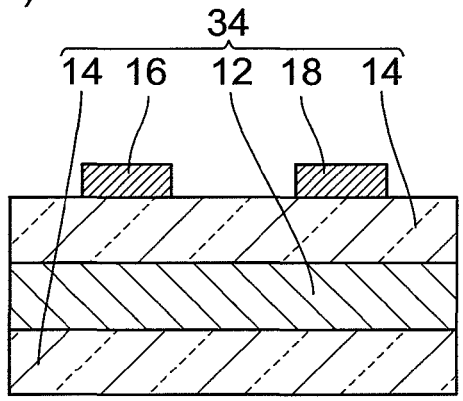
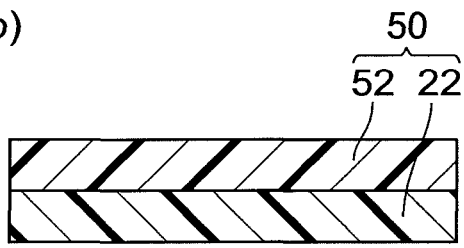
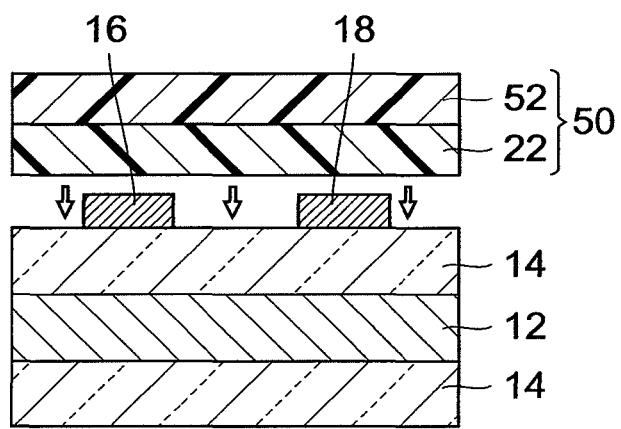
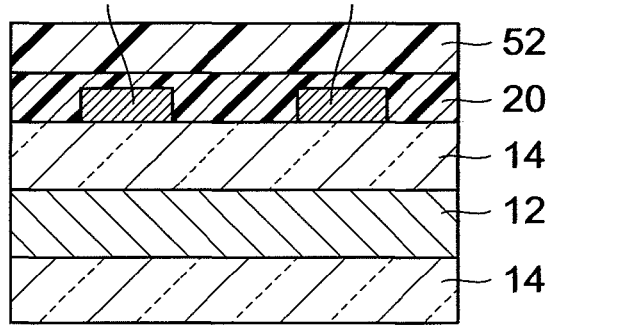

Fig.14
(e)
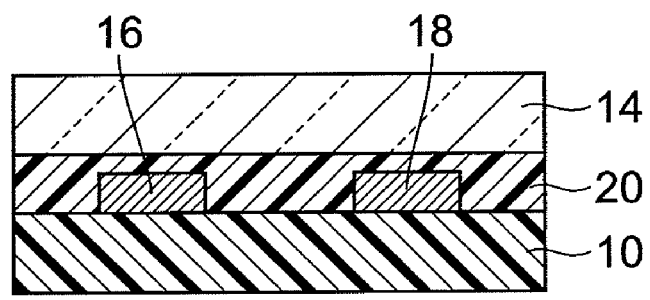
(f)
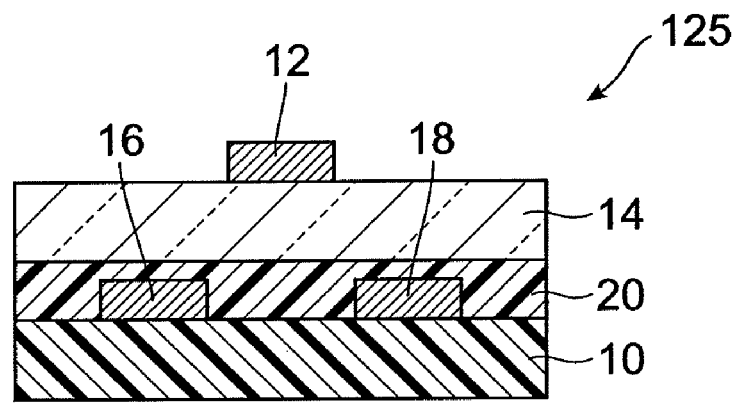

Fig.16
(a)
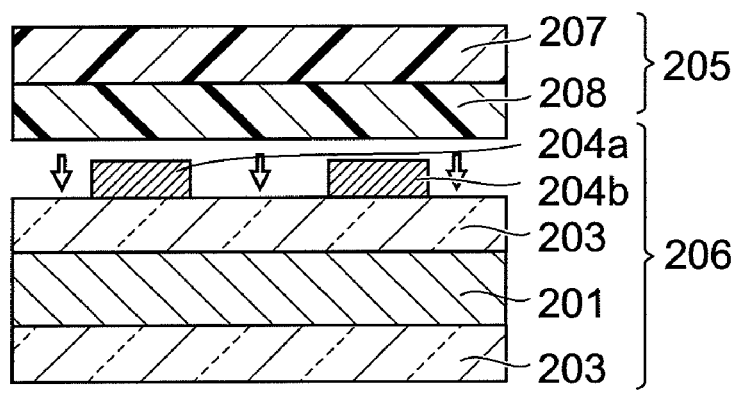
(b)
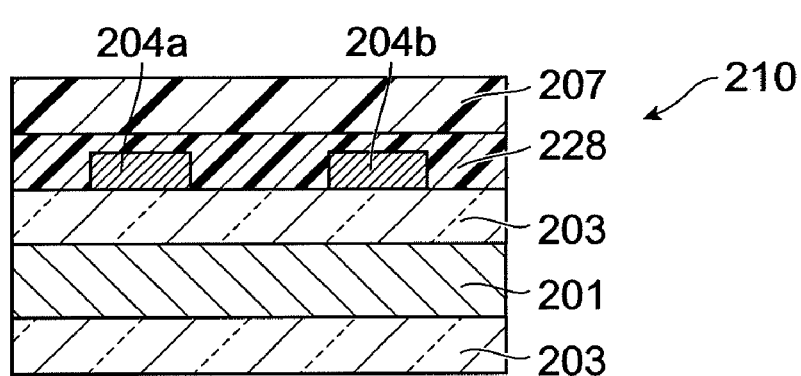

TRANSISTOR, METHOD FOR MANUFACTURING SAME, AND SEMICONDUCTOR DEVICE COMPRISING SUCH TRANSISTOR

TECHNICAL FIELD

The present invention relates to a transistor and a process for its production, and to a semiconductor device comprising the transistor.

BACKGROUND ART

A wide variety of transistor types are known including bipolar transistors, field-effect transistors static induction transistors, and the like. Among such transistor types, field-effect transistors generally have a structure with a gate electrode formed via an insulating layer on a layer composed of a semiconductor material (active layer) on which a source electrode and drain electrode are connected. Among field-effect transistor types, in turn, organic transistors employing organic semiconductor compounds in the active layers exhibit advantages of light weight and flexibility and have numerous potential applications in electronic devices. The active layers of such organic transistors are usually formed by vapor deposition of organic semiconductor compounds, or spin coating, drop casting or printing of organic semiconductor compound-containing solutions, onto insulating layers that have been formed on substrates (Non-patent document 1).

In such organic transistors, the active layers are imparted with a prescribed orientation to enhance the carrier mobility. The advantage in terms of carrier mobility is attributed to the fact that the organic semiconductor compound of the active layer is aligned in a constant direction. As production processes for organic transistors that allow such orientation of active layers, there have been disclosed processes that include a step of providing a rubbing oriented film between the substrate and active layer (Non-patent documents 2 and 3), a step of rubbing the active layer (Non-patent document 4), or a step of forming an active layer composed of a friction-transfer film (Patent document 1). The organic transistors obtained by these production processes are known to have superior carrier mobility compared to those with non-oriented active layers.
[Non-patent document 1] "Technologies For Enhancing Operation of Organic Transistors", 2003, Technical Information Institute Co., Ltd.
[Non-patent document 2] H. Sirringhaus et al., Appl. Phys. Lett., Vol. 77, No. 3, p. 406-408, 2002
[Non-patent document 3] M. L. Swiggers et al., Appl. Phys. Lett., Vol. 79, No. 9, p. 1300-1302, 2001
[Non-patent document 4] H. Heil et al., Appl. Phys. Lett., Vol. 93, No. 3, p. 1636-1641, 2003
[Patent document 1] Japanese Unexamined Patent Publication No. 2004-356422

DISCLOSURE OF THE INVENTION

Problems to be Solved by the Invention

However, the aforementioned conventional organic transistor production processes that are aimed at improving carrier mobility by forming oriented active layers all involve complex steps for active layer orientation, and production of organic transistors has therefore tended to be considerably more difficult than without active layer orientation.

It is therefore an object of the present invention, which has been accomplished in light of the circumstances described above, to provide a process for production of a transistor that can form an oriented active layer by a convenient method and produce a transistor with excellent carrier mobility. It is another object of the invention to provide an organic transistor with high carrier mobility, provided with an oriented active layer.

Means for Solving the Problems

In order to achieve the objects stated above, the transistor production process of the invention is process for production of a transistor with an active layer composed of an organic semiconductor compound-containing semiconductor film, the process being characterized by including a step of stretching the semiconductor film and a step of pasting the semiconductor film onto the side on which the active layer is to be formed while heating and/or pressing, to obtain the active layer.

In the step of stretching the semiconductor film, the stretching aligns the organic semiconductor compound of the semiconductor film in the direction of stretching, thus allowing the prescribed orientation to be imparted to the semiconductor film. According to the invention, therefore, an oriented active layer can be obtained merely be stretching the semiconductor film, and such formation of an oriented active layer is easier than by prior art processes. In the production process of the invention described above, the semiconductor film is pasted onto the surface on which the active layer is to be formed, while heating and/or pressing. The active layer is therefore strongly bonded to its adjacent layer and can satisfactory exhibit its properties such as carrier mobility.

In the production process of the invention, the step of stretching the semiconductor film may be carried out first and the stretched semiconductor film pasted afterwards, or the unstretched semiconductor film may be pasted first and then stretched. All of the conventional production processes referred to above involve orienting during or after formation of the active layer, but pasting of the stretched semiconductor film, as in the former case, allows suitable prior orientation of the semiconductor film which is to serve as the active layer, thus facilitating formation of an active layer with the desired orientation.

Another mode of the transistor production process of the invention is a process for production of a transistor with an active layer composed of an organic semiconductor compound-containing semiconductor film, characterized by including a step of orienting the semiconductor film and a step of pasting the semiconductor film onto the side on which the active layer is to be formed while heating and/or pressing, to form the active layer. According to this mode of the invention, the semiconductor film is pasted while heating and/or pressing so that active layers oriented by methods other than stretching can be satisfactorily formed.

Still another mode of the transistor production process of the invention is a process for production of a transistor with an active layer composed of an organic semiconductor compound-containing semiconductor film, characterized by including a step of orienting the semiconductor film by stretching and a step of pasting the semiconductor film onto the side on which the active layer is to be formed while heating and/or pressing, to form the active layer. Orienting the semiconductor film by stretching in this manner can notably facilitate formation of an active layer exhibiting high carrier mobility by orientation.

In this mode of the transistor production process of the invention, the semiconductor film is preferably pasted onto the side on which the active layer is to be formed with a working liquid situated between them. This will cause the working liquid to wet the contact surface between the semiconductor film and the side, thus allowing satisfactory pasting even when the semiconductor film is warped, for example. Since pasting is facilitated by using such a working liquid, the heating or pressing during pasting can be carried out under more moderate temperature conditions. This can therefore reliably prevent deformation or defects in the transistor that can potentially occur by excessive heating or pressing. In addition, using a working liquid improves the adhesiveness between the active layer and the surface on which it is formed. The working liquid is preferably one with a contact angle of no greater than 120 degrees with the side on which the active layer is to be formed.

More specifically, the transistor production process of the invention is preferably applied for production of a transistor having the construction described below. That is, the transistor production process of the invention is preferably a process for production of a transistor provided with a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode, wherein the process includes a step of stretching the semiconductor film and a step of attaching the semiconductor film to the insulating layer while heating and/or pressing to obtain the active layer.

Another mode of the transistor production process of the invention is a process for production of a transistor provided with a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode, wherein the process includes a step of orienting the semiconductor film and a step of attaching the semiconductor film to the insulating layer while heating and/or pressing to obtain the active layer.

Still another mode of the transistor production process of the invention is a process for production of a transistor provided with a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode, wherein the process includes a step of orienting the semiconductor film by stretching and a step of attaching the semiconductor film to the insulating layer while heating and/or pressing to obtain the active layer.

These transistor production processes also allow easy formation of active layers oriented by stretching of the semiconductor films, and heating and/or pressing during the pasting can satisfactorily form active layers on the insulating layers. It is thereby possible to obtain transistors with high carrier mobility.

In the transistor production processes described above, the semiconductor film is preferably attached onto the insulating layer with the working liquid situated between it and the insulating layer. This will permit even more satisfactory attachment between the semiconductor film and insulating layer, allowing the heating or pressing conditions to be more moderate to further reduce deformation or defects in the transistor.

A transistor having such a construction which is produced by the production process of the invention preferably has a layer composed of a compound different from the organic semiconductor compound, between the source electrode and/or drain electrode and the active layer. By providing another active layer of this type, it is possible to reduce the contact resistance between the source and drain electrodes and the active layer that contains the organic semiconductor compound and functions as the carrier transport layer, thus increasing the carrier mobility.

The invention further provides a transistor that can be satisfactorily obtained by a transistor production process of the invention described above. Specifically, the transistor of the invention comprises an active layer composed of an organic semiconductor compound-containing semiconductor film, characterized in that the active layer is made of a stretched semiconductor film and the semiconductor film is formed by pasting to the side on which the active layer is to be formed, while heating and/or pressing.

Since the active layer of this type of transistor comprises a stretched semiconductor film, it is in a condition with the prescribed orientation. Furthermore, since the active layer is formed by pasting the semiconductor film on the side on which the active layer is to be formed while heating or pressing, the active layer has satisfactory adhesiveness with that side. Consequently, the transistor of the invention comprising such an active layer has high carrier mobility, high interlayer adhesiveness and excellent transistor characteristics.

The transistor of the invention may also comprise an active layer composed of an organic semiconductor compound-containing semiconductor film wherein the active layer is made of an oriented semiconductor film, and may be formed by pasting the semiconductor film to the side on which the active layer is to be formed while heating and/or pressing.

Alternatively, it may comprise an active layer composed of an organic semiconductor compound-containing semiconductor film wherein the active layer is made of a oriented semiconductor film by stretching, and may be formed by pasting the semiconductor film onto the side on which the active layer is to be formed while heating and/or pressing.

Since these transistor types also have satisfactorily formed active layers that are oriented and have excellent adhesiveness with their adjacent surfaces, they are able to exhibit high carrier mobility, high interlayer adhesiveness and excellent transistor characteristics. The transistors also preferably have their active layers formed by pasting via a working liquid as described above.

The following structures are especially preferred for the transistor of the invention. Specifically, it may comprise a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode, wherein the active layer is one that is made of a stretched semiconductor film and has been formed by attaching the semiconductor film onto the insulating layer while heating and/or pressing.

Alternatively, it may comprise a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode, wherein the active layer is one that is made of an oriented semiconductor film and has been formed by attaching the semiconductor film onto the insulating layer while heating and/or pressing.

It may yet alternatively comprise a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode, wherein the active layer is one that is made of a oriented semiconductor film by stretching and has been formed by attaching the semiconductor film onto the insulating layer while heating and/or pressing.

Since these transistor types all have active layers that are oriented and have excellent adhesiveness with their adjacent surfaces, similar to the transistors of the invention described above, they are also able to exhibit high carrier mobility, high interlayer adhesiveness and excellent transistor characteristics. These transistors also preferably have their active layers formed by attachment via a working liquid. Even more preferably, they also have a layer composed of a compound different from the organic semiconductor compound, between the source electrode and/or drain electrode and the active layer.

The invention further provides a semiconductor device comprising a transistor of the invention as described above. Such a semiconductor device can exhibit satisfactory properties due to the excellent transistor characteristics of the transistor of the invention as described above.

Effect of the Invention

According to the invention there is provided a transistor production process that allows formation of oriented active layers by a convenient method and yields transistors with excellent carrier mobility, as well as organic transistors with high carrier mobility that comprise such oriented active layers.

BRIEF DESCRIPTION OF THE DRAWINGS

FIG. 9 is a process drawing for a transistor production process according to a third embodiment.

FIG. 14 is a process drawing for a transistor production process according to the sixth embodiment.

FIG. 16 is a drawing illustrating some of the production steps for the transistors of Comparative Examples 2-5.

EXPLANATION OF SYMBOLS

Figure 1:
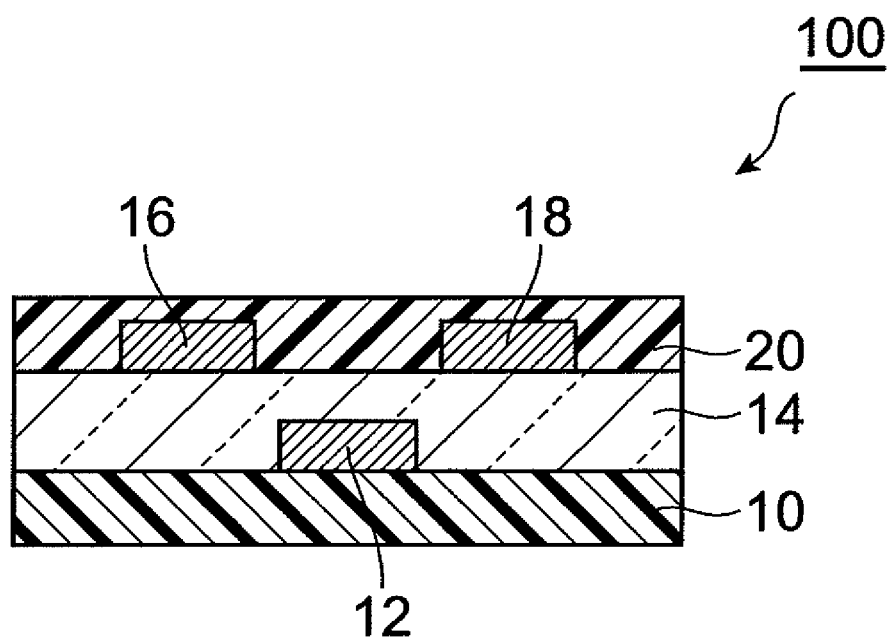
FIG. 1 is a schematic cross-sectional view of a transistor according to a first embodiment.

9: Working liquid, 10: substrate, 12: gate electrode, 14: insulating layer, 16: source electrode, 18: drain electrode, 20, 24: active layers, 22, 26: semiconductor films, 30, 32, 34, 64: element boards, 36,38: first element boards, 40: working liquid, 50: laminated body, 52: support film, 60,62: second element boards, 100, 105, 110, 115, 120, 125, 200, 210, 300: transistors, 201: n-type silicon substrate, 203: insulating layer, 204a: source electrode, 204b: drain electrode, 205: laminated body, 206, 216: element board, 207: support film, 208: poly(3-hexylthiophene) film, 215: stretching laminated body, 217: stretched support film, 218: stretched poly(3-hexylthiophene) film, 220: stretched active layer, 228: unstretched active layer, 500: 4-(trifluoromethyl)thiophenol layer.

BEST MODE FOR CARRYING OUT THE INVENTION

Preferred embodiments of the invention will now be explained in detail, with reference to the accompanying drawings. Throughout the explanation of the drawings, corresponding elements will be referred to by like reference numerals and will be explained only once. Also, some of the drawings are exaggerated in size for easier illustration, and the dimensional proportions will not necessarily match those in the explanation.

Preferred embodiment of a transistor and a process for its production will be explained below, the present invention used may be any one without restrictions, so long as it is a current-amplifying or switching semiconductor element and transistor which comprises an organic semiconductor compound-containing active layer. The transistor has a construction provided with an active layer and another layer adjacent to the active layer, wherein the active layer is formed on the side of the other layer where the active layer is to be formed. As such transistors there may be mentioned bipolar transistors, static induction transistors, field-effect transistors and the like.

The explanation that follows below assumes a transistor comprising a source electrode and drain electrode, an active layer containing an organic semiconductor compound as a current channel between the electrodes, a gate electrode that controls the current flowing through the current channel and an insulating layer disposed between the active layer and gate electrode, and a production process for the same. Examples of, for example, field-effect transistors having such a construction include those with planar, reverse-staggered, staggered and other structures.

First, the structures of transistors according to the first to sixth embodiments will be explained with reference to FIGS. 1 to 6.

FIG. 1 is a schematic cross-sectional view of a transistor according to the first embodiment. The transistor 100 shown in FIG. 1 comprises a substrate 10, a gate electrode 12 formed on the substrate 10, an insulating layer 14 formed on the substrate 10 covering the gate electrode 12, a source electrode 16 and drain electrode 18 formed on the insulating layer 14, and an active layer 20 formed on the insulating layer 14 covering the source electrode 16 and drain electrode 18.

Figure 2:
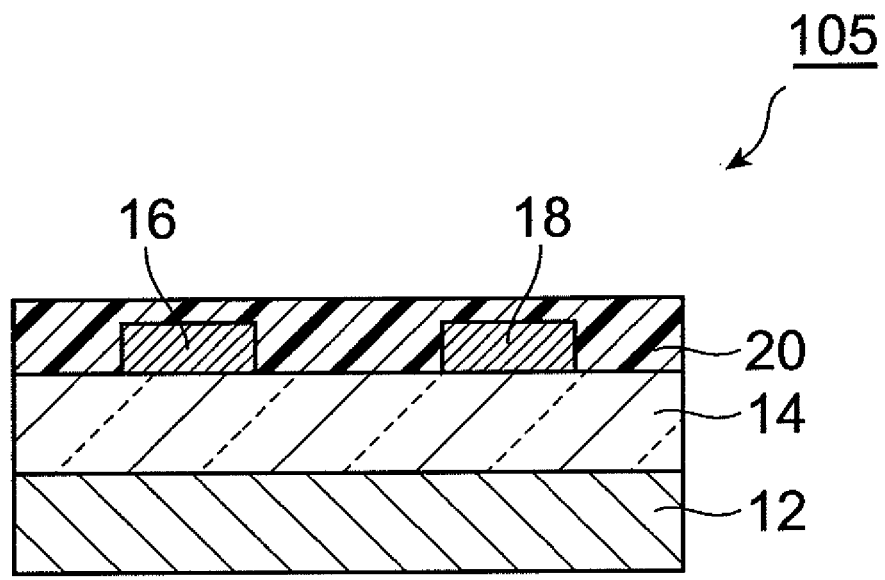
FIG. 2 is a schematic cross-sectional view of a transistor according to a second embodiment.

FIG. 2 is a schematic cross-sectional view of a transistor according to the second embodiment. The transistor 105 shown in FIG. 2 comprises a gate electrode 12, an insulating layer 14 formed on the gate electrode 12, a source electrode 16 and drain electrode 18 formed on the insulating layer 14, and an active layer 20 formed on the insulating layer 14 covering the source electrode 16 and drain electrode 18. The gate electrode 12 of the transistor 105 also provides the function of the substrate 10 in the transistor 100 of the first embodiment.

Figure 3:
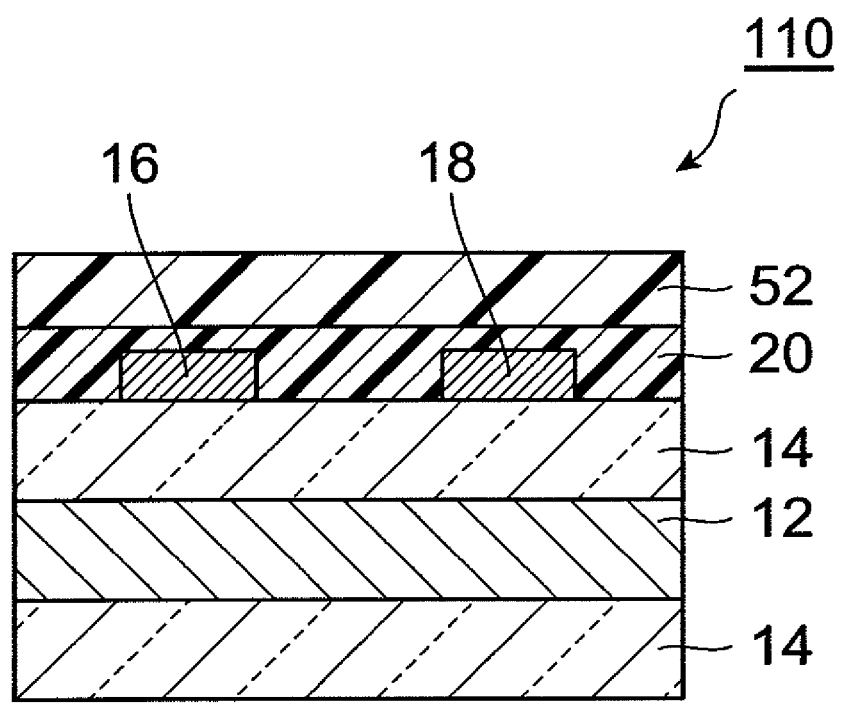
FIG. 3 is a schematic cross-sectional view of a transistor according to a third embodiment.

FIG. 3 is a schematic cross-sectional view of a transistor according to the third embodiment. The transistor 110 shown in FIG. 3 comprises a gate electrode 12, insulating layers 14 formed on both sides of the gate electrode 12, a source electrode 16 and drain electrode 18 formed on one side of the insulating layer 14, an active layer 20 formed on the insulating layer 14 covering the source electrode 16 and drain electrode 18, and a support film 52 formed on the active layer 20. The gate electrode 12 of the transistor 110 also provides the function of the substrate 10 in the transistor 100 of the first embodiment.

Figure 4:
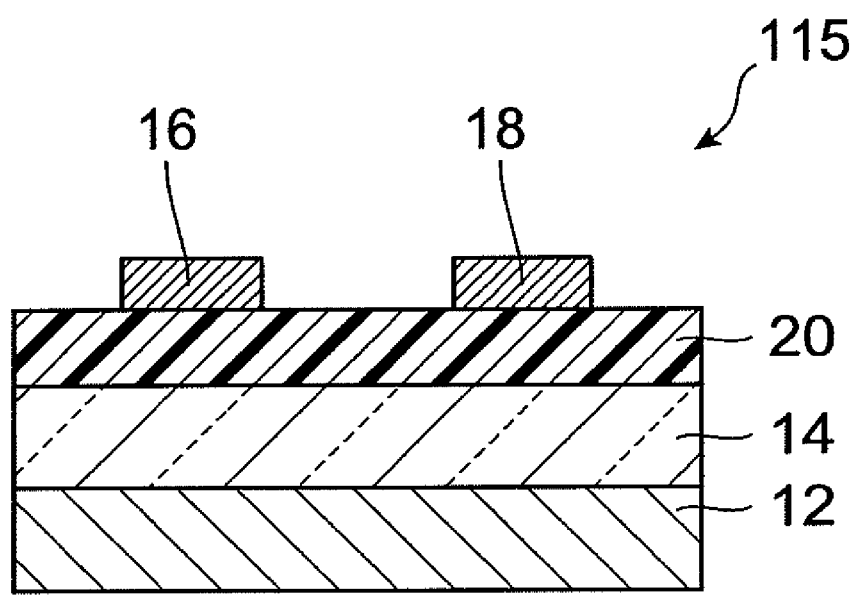
FIG. 4 is a schematic cross-sectional view of a transistor according to a fourth embodiment.

FIG. 4 is a schematic cross-sectional view of a transistor according to the fourth embodiment. The transistor 115 shown in FIG. 4 comprises a gate electrode 12, an insulating layer 14 formed on the gate electrode 12, an active layer 20 formed on the insulating layer 14 and a source electrode 16 and drain electrode 18 formed on the active layer 20.

Figure 5:
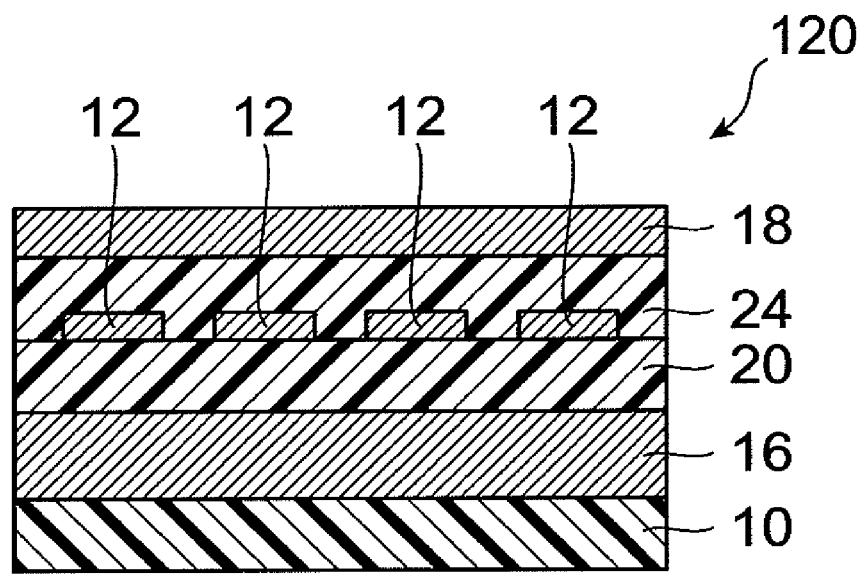
FIG. 5 is a schematic cross-sectional view of a transistor according to a fifth embodiment.

FIG. 5 is a schematic cross-sectional view of a transistor according to the fifth embodiment. The transistor 120 is a static induction organic thin-film transistor. The transistor 120 shown in FIG. 5 comprises a substrate 10, a source electrode 16 formed on the substrate 10, an active layer 20 formed on the source electrode 16, a plurality (four in this case) of gate electrodes 12 formed on the active layer 20, an active layer 24 formed on the active layer 20 covering the gate electrodes 12, and a drain electrode 18 formed on the active layer 24. In this transistor 120, the two active layers 20 and 24 may be layers composed of the same material, or they may be layers composed of different materials.

Figure 6:
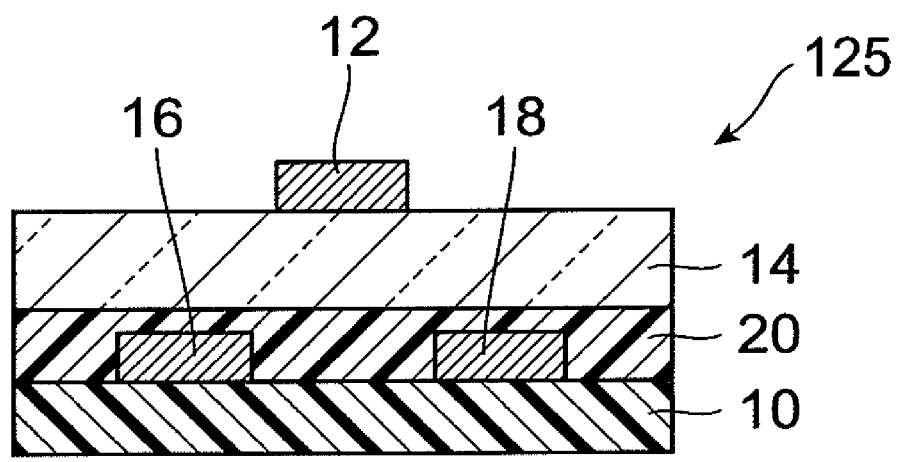
FIG. 6 is a schematic cross-sectional view of a transistor according to a sixth embodiment.

FIG. 6 is a schematic cross-sectional view of a transistor according to the sixth embodiment. This transistor 125 comprises a substrate 10, a source electrode 16 and drain electrode 18 formed on the substrate 10, an active layer 20 formed on the substrate 10 covering the source electrode 16 and drain electrode 18, an insulating layer 14 formed on the active layer 20, and a gate electrode 12 formed on the insulating layer 14.

In the transistor of the first to fourth and sixth embodiments described above, the active layer 20 is a layer containing an organic semiconductor compound, and it serves as a current channel between the source electrode 16 and drain electrode 18. The gate electrode 12 controls the current flowing through the current channel of the active layer 20 by application of voltage.

In the transistor of the fifth embodiment, the active layers 20 and 24 contain organic semiconductor compounds and serve as current channels between the source electrode 16 and drain electrode 18. The gate electrode 12 controls current flowing through the current channel in the same manner described above.

Transistor production processes according to each of the embodiments described above will now be explained, including more detailed explanations of the structures of the transistors.

(Production Process for Transistor of First Embodiment)

Figure 7:
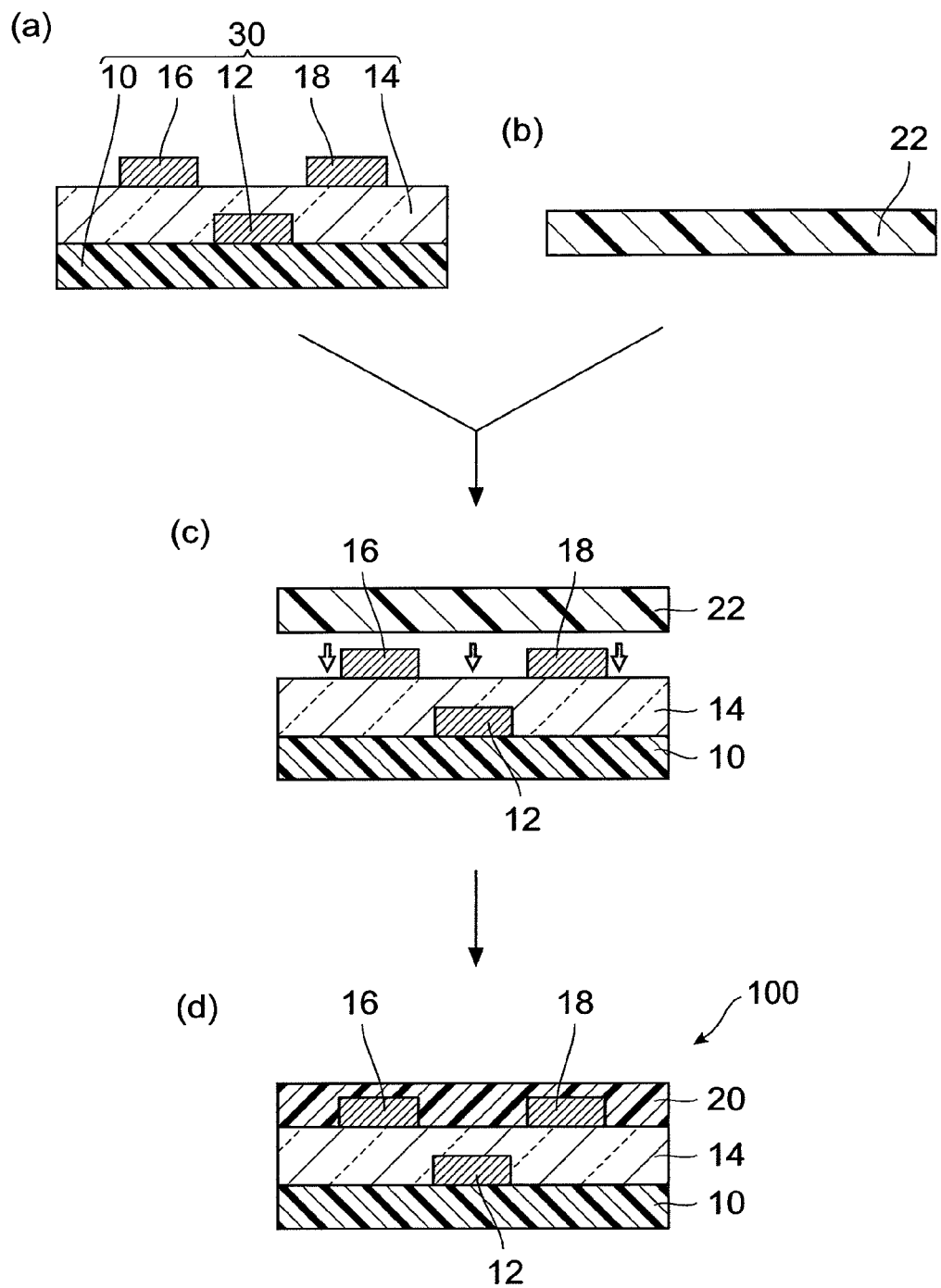
FIG. 7 is a process drawing for a transistor production process according to a first embodiment of the invention.

A transistor production process according to the first embodiment will be explained first. FIG. 7 is a process drawing for a transistor production process according to the first embodiment. In this production process, there is first prepared an element board 30 comprising a substrate 10, a gate electrode 12 formed on the substrate 10, an insulating layer 14 formed on the substrate 10 covering the gate electrode 12 and a source electrode 16 and drain electrode 18 formed on the insulating layer 14 (FIG. 7(a)). Separately there is prepared an semiconductor film 22 serving as the organic semiconductor compound-containing active layer 20 (FIG. 7(b)).

The substrate 10 used should not interfere with the properties of the field-effect transistor, and there may be mentioned silicon substrates, glass substrates, plastic substrates, stainless steel foil substrates and the like. The insulating layer 14 is composed of a material with a high electrical insulating property, and for example, silicon oxide, silicon nitride, aluminum oxide, tantalum oxide or an insulating polymer may be used. As insulating polymers there may be mentioned polyimides, poly(vinylphenols), polyesters, methacrylic resins, polycarbonates, polystyrenes, parylene and the like.

The insulating layer 14 may also have the surface physically or chemically modified by any of various methods. As examples of physical modification methods there may be mentioned ozone UV and $O_2$ plasma treatment. As an example of a chemical modification method there may be mentioned treatment with a surface treatment agent such as a silane coupling agent. As surface treatment agents there may be mentioned alkylchlorosilanes, alkylalkoxysilanes, alkylchlorosilane fluorides, alkylalkoxysilane fluorides, and silylamine compounds such as hexamethyldisilazane. The surface treatment may involve, for example, contacting the insulating layer 14 with a solution or gas containing the surface treatment agent, and the surface treatment agent may be adsorbed onto the surface of the insulating layer 14. Before surface treatment, the surface of the insulating layer 14 to be treated may be pre-treated by ozone UV or $O_2$ plasma.

The method of forming the insulating layer 14 on the substrate 10 may be, for example, a method such as plasma CVD, thermal vapor deposition, thermal oxidation, anodic oxidation, spin coating, casting, microgravure coating, gravure coating, bar coating, roll coating, wire bar coating, dip coating, spray coating, screen printing, flexographic printing, offset printing, ink jet printing or the like.

The gate electrode 12, source electrode 16 and drain electrode 18 are made of conductive materials. Examples of conductive materials include metals such as aluminum, gold, platinum, silver, copper, chromium, nickel or titanium, conductive oxides such as ITO, and conductive polymers including polymer blends of poly(3,4-ethylenedioxythiophene) and polystyrenesulfonic acid. The conductive material may also have metal fine particles, carbon black or graphite microparticles dispersed in a binder.

The element board 30 having the construction described above can be fabricated by a known transistor production process, and for example, the process described in U.S. Pat. No. 6,107,117 may be used.

The semiconductor film 22 to serve as the active layer 20 may consist entirely of the organic semiconductor compound, or it may also contain components in addition to the organic semiconductor compound. As organic semiconductor compounds there may be mentioned low molecular organic semiconductor compounds and macromolecular organic semiconductor compounds. As added components there may be mentioned dopants, modulating materials to modulate the carrier in the active layer 20, and macromolecular materials to increase the mechanical properties of the semiconductor film. The semiconductor film 22 may contain different types of organic semiconductor compounds, and different types of added components. Macromolecular organic semiconductor compounds rather than low molecular organic semiconductor compounds are preferred from the viewpoint of obtaining satisfactory film formability.

The following compounds may be mentioned as examples of low molecular organic semiconductor compounds and macromolecular organic semiconductor compounds. However, the organic semiconductor compound in the active layer 20 of the transistor of the invention is not limited only to those mentioned below.

As low molecular organic semiconductor compounds there may be mentioned polyacene compounds such as anthracene, tetracene, pentacene, benzopentacene, dibenzopentacene, tetrabenzopentacene, naphthopentacene, hexacene, heptacene and nonacene; coronene compounds such as phenanthrene, pycene, fulminene, pyrene, antanthrene, peropyrene, coronene, benzocoronene, dibenzocoronene, hexabenzocoronene, benzodicoronene and vinylcoronene; perylene compounds such as perylene, terylene, diperylene and quaterrylene; trinaphthene, heptaphene, ovalene, rubicene, violanthrone, isoviolanthrone, chrysene, circumanthracene, bisanthene, zethrene, heptazethrene, pyranthene, violanthene, isoviolanthene, biphenyl, triphenylene, terphenyl, quaterphenyl, circobiphenyl, kekulene, phthalocyanine, porphyrin, fullerenes (C60, C70), tetrathiofulvalene compounds, quinone compounds, tetracyanoquinodimethane compounds, polythiophene oligomers, polypyrrole oligomers, polyphenylene oligomers, polyphenylenevinylene oligomers, polythienylenevinylene oligomers, thiophene-phenylene copolymer oligomers, thiophene-fluorene copolymer oligomers and the like. Derivatives of these low molecular organic semiconductor compounds may also be used. One example of such a compound is rubrene, a benzene-added derivative of tetracene. Other examples include carbon nanotubes which are extended conjugated systems of fullerenes.

As macromolecular organic semiconductor compounds there may be mentioned polythiophene, polyphenylene, polyaniline, polyphenylenevinylene, polythienylenevinylene, polyacetylene, polydiacetylene, polytriphenylamine, triphenylamine-phenylenevinylene copolymers, thiophene-phenylene copolymers, thiophene-fluorene copolymers and the like. Derivatives of these high molecular organic semiconductor compounds may also be used. An example of such a compound is poly(3-hexylthiophene), an alkyl-substituted polythiophene.

The following structures are specific examples of macromolecular organic semiconductor compounds.

[Chemical Formula 1]

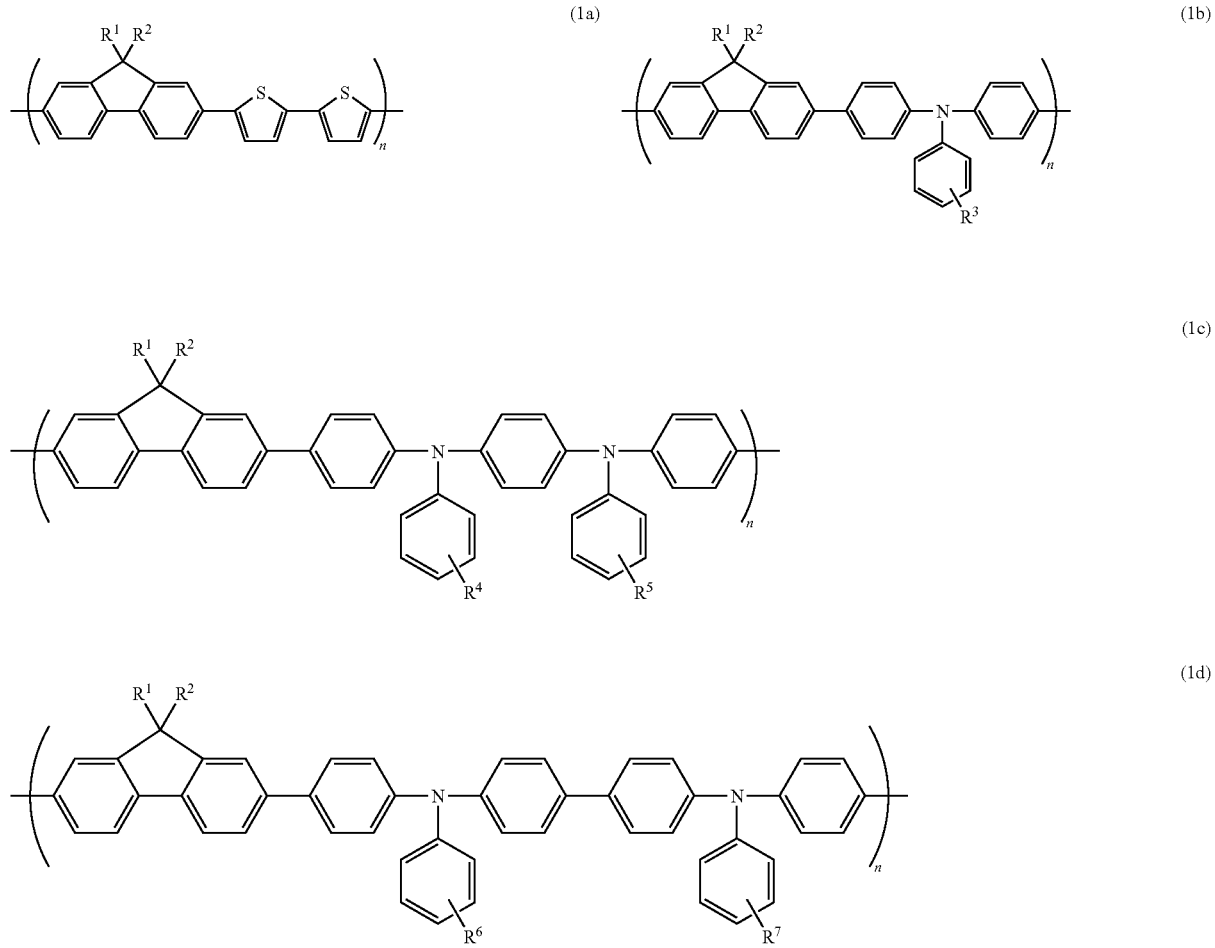

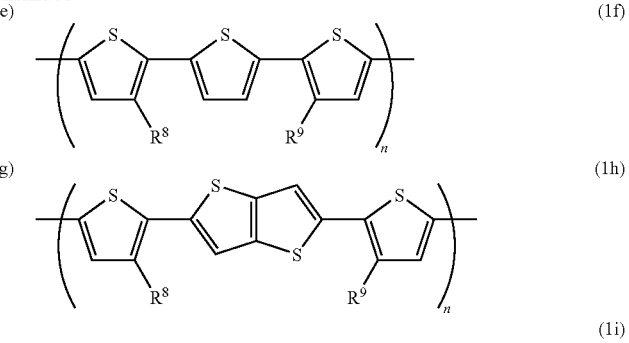

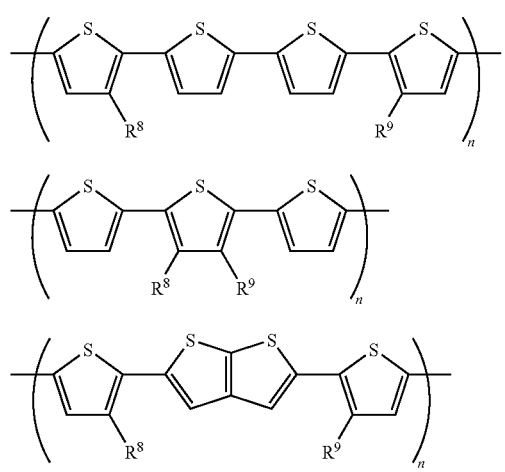

In formulas (1a)-(1i), $R^1, R^2, R^3, R^4, R^5, R^6, R^7, R^8$, and $R^9$ each independently represent alkyl, alkoxy, alkylthio, aryl, aryloxy, arylthio, arylalkyl, arylalkoxy, arylalkylthio, arylalkenyl, arylalkynyl, amino, substituted amino, silyl, substituted silyl, silyloxy, substituted silyloxy, monovalent heterocyclic group, a halogen atom or a cyano group, and n is an integer of 1 or greater.

As dopants which may be added in addition to the organic semiconductor compound there may be mentioned acceptor dopants and donor dopants.

First, examples of acceptor dopants include halogens such as iodine, bromine, chlorine, iodine chloride and iodine bromide, sulfur oxide compounds such as sulfuric acid, sulfuric anhydride, sulfur dioxide and sulfates; nitrogen oxide compounds such as nitric acid, nitrogen dioxide and nitrates; halogenated compounds such as perchloric acid and hypochlorous acid, acids such as tetrafluoroboric acid, tetrafluoroboric acid salt, phosphoric acid, phosphoric acid salt and trifluoroacetic acid and their salts; and tetracyanoquinodimethane, tetrachlorotetracyanoquinodimethane, tetrafluorotetracyanoquinodimethane, tetracyanoethylene, dichlorocyanoethylene, dichlorodicyanoquinone, tetrachloroquinone, carbon dioxide, oxygen and the like.

Examples of donor dopants include tetrathiafulvalene, tetramethyltetrathiafulvalene and tetraselenathiafulvalene; amine compounds such as diphenylphenylenediamine, tetraphenylphenylenediamine, tetraphenyldiaminodiphenyl and polyvinylcarbazole; alkali metals, alkaline earth metals, rare earth metals, and complexes of such metals with organic compounds.

As modulating materials for modulation of the carrier in the active layer 20 there may be mentioned conductive materials, including transition metals such as aluminum, iron, copper, nickel, zinc, silver, platinum and gold, and fine particles of the same.

As macromolecular materials to increase the mechanical properties of the semiconductor film 22 there may be mentioned polycarbonates, polyacrylates, polymethyl acrylate, polymethyl methacrylate, polystyrene, polyvinyl chloride, polysiloxanes and the like.

For production of an semiconductor film 22 as described above, first the organic semiconductor compound or the organic semiconductor compound and other added components are dissolved and dispersed in an organic solvent to prepare a solution. The solution is then coated onto, for example, a polytetrafluoroethylene resin board and the organic solvent is volatilized off. An semiconductor film 22 is obtained by this procedure. The semiconductor film 22 is preferably released from the polytetrafluoroethylene resin board when the semiconductor film 22 is used.

As organic solvents in the solution for production of the semiconductor film 22 there may be mentioned chlorine-based solvents such as chloroform, methylene chloride, dichloroethane and trichlorobenzene; ether-based solvents such as tetrahydrofuran; aromatic hydrocarbon-based solvents such as toluene, xylene, mesitylene, tetralin, decalin and n-butylbenzene; and alkoxy group-containing aromatic solvents such as anisole.

Examples of solution coating methods include spin coating, casting, microgravure coating, gravure coating, bar coating, roll coating, wire bar coating, dip coating, spray coating, screen printing, flexographic printing, offset printing, ink jet printing and the like.

In the transistor production process according to the first embodiment, formation of the semiconductor film 22 having the construction described above is followed by stretching of the obtained semiconductor film 22. Examples of stretching methods for the semiconductor film 22 include methods employing uniaxial stretching, biaxial stretching, liquid imbibition stretching and roll stretching.

Uniaxial stretching is a method in which a pair of opposing sides of a rectangular semiconductor film 22 are gripped with a chuck and pulled in opposite directions. The pulling may be at room temperature, or with appropriate heating. The pulling may also be carried out in a specific gas atmosphere such as nitrogen gas.

Biaxial stretching is a method in which both pairs of opposing sides of a rectangular semiconductor film 22 are gripped with a chuck and the film is pulled in the two directions either simultaneously or successively. The pulling may be at room temperature, or with appropriate heating. The pulling may also be carried out in a specific gas atmosphere such as nitrogen gas.

Liquid imbibition stretching is a method in which the semiconductor film 22 is immersed in a suitable solution in which the semiconductor film 22 swells without dissolving, and the film is pulled by uniaxial stretching or biaxial stretching as described above while in the solution. This manner of pulling may also be carried out at room temperature, or with appropriate heating.

Stretching by such methods will consistently align the organic semiconductor compound composing the semiconductor film 22 in the stretching direction. That is, the stretching results in orientation of the semiconductor film 22 in the stretching direction. The active layer 20 composed of the semiconductor film 22 oriented in this manner has high carrier mobility. Thus, the transistor 100 (similar to the transistors 105, 110, 115, 120 and 125 described hereunder) having the active layer 22 formed from the stretched semiconductor film 22 has excellent transistor characteristics from the viewpoint of carrier mobility.

For this embodiment, a pasting step is performed in which the stretched semiconductor film 22 is attached to the insulating layer 14 of the element board 30 while heating and/or pressing (FIG. 7(*c*)). The side of the insulating layer 14 on which the semiconductor film 22 has been pasted is the side on which the active layer 20 is to be formed. The actual method used for the attachment is not particularly restricted, and as an example, the semiconductor film 22 is first placed on the insulating layer 14 on which the source electrode 16 and drain electrode 18 have been formed. Next, the semiconductor film 22 placed on the insulating layer 14 is heated and/or pressed for bonding to the insulating layer 14.

Either or both heating and pressing may be carried out in the pasting step. When both are carried out, the heating and pressing may be performed simultaneously or one after the other. For further improved adhesiveness, the attachment in the pasting step may be conducted under reduced pressure. Heating in air can produce undesirable alterations in properties by oxidation and the like, depending on the organic semiconductor compound. The pasting step may therefore be carried out, if necessary, not only under reduced pressure but alternatively in a nitrogen atmosphere, under light-shaded conditions, or under conditions with controlled moisture, oxygen or the like.

If the heating or pressing is carried out under excessive conditions in the pasting step, however, the characteristics (such as orientation) of the semiconductor film 22 may be altered and it may be difficult to obtain an active layer 20 with the desired characteristics. The heating and pressing are therefore preferably carried out under moderate conditions. Suitable heating conditions are, for example, temperature conditions of above room temperature but low enough to avoid deformation of the semiconductor film 22, the insulating layer 14 attaching this or the element board 30. For example, when the semiconductor film 22 is composed of a macromolecular organic semiconductor compound, a temperature of no higher than the liquid crystal phase or isotropic transition temperature is preferred. On the other hand, when the semiconductor film 22 is composed of a low molecular organic semiconductor compound, a temperature of no higher than its melting point is preferred. However, heating may also be performed at a higher temperature for a short period that does not cause the aforementioned problems.

Pressing is carried out in the direction of lamination of the semiconductor film 22 and insulating layer 14, and for example, a load may be applied on the semiconductor film 22 or a roll may be used to press both the semiconductor film 22 and element board 30. The pressure applied is preferably at a level that does not produce deformation or defects in the semiconductor film 22 or in the insulating layer 14, substrate 10, source electrode 16 or drain electrode 18 of the element board 30.

A working liquid may also be situated between the semiconductor film 22 and insulating layer 14 in the pasting step. The working liquid used is a liquid substance having a property allowing it to wet both the insulating layer 14 and semiconductor film 22. This will allow the semiconductor film 22 and insulating layer 14 to be satisfactorily wetted to further enhance the adhesiveness between them.

The working liquid is more preferably one whose contact angle with the side of the insulating layer 14 on which the active layer 20 is to be formed is no greater than 120 degrees, more preferably no greater than 90 degrees and even more preferably no greater than 60 degrees. When a droplet of the working liquid is formed on the insulating layer 14 in air, the "contact angle" is the angle that includes the working liquid, among angles measured between the surface of the insulating layer 14 and the tangent drawn to the working liquid from the contact point of the three-phases.

The working liquid is preferably selected as appropriate for the type of insulating layer 14 (based on its contact angle with the insulating layer 14). For example, when the surface of the insulating layer 14 is a silicon oxide ($SiO_2$ or the like), alkyltrichlorosilane (e.g. octadecyltrichlorosilane)-modified silicon oxide, silicon nitride or organic insulating film, the working liquid is preferably a C1-8 alcohol-based solvent such as methanol, ethanol or isopropanol, a ketone-based solvent such as acetone, an ether-based solvent such as diethyl ether, a halogen-based solvent such as chloroform (preferably combined with an alcohol or the like), an aromatic hydrocarbon-based solvent such as toluene (preferably combined with an alcohol or the like), an aliphatic hydrocarbon-based solvent such as hexane, heptane or octane, water (preferably containing a surfactant), a nitrile-based solvent such as acetonitrile, an ester-based solvent such as ethyl acetate, or a solvent containing an amine-based compound such as ammonia water.

The working liquid may also contain added substances such as surfactants to adjust the wettability with the insulating layer 14, dopants that can adjust the transistor characteristics of the active layer 20, or materials for adjustment of the carrier concentration in the active layer 20. The aforementioned solvents mentioned as examples for the working liquid may be used alone or in mixtures of two or more.

An example of a method of situating the working liquid between the semiconductor film 22 and insulating layer 14 and attaching them is a method in which the working liquid is coated onto the surface of either the semiconductor film 22 or the insulating layer 14 and the other surface is the laminated over the working liquid. According to a different method, a prescribed gap is maintained between the semiconductor film 22 and insulating layer 14 and the working liquid is injected into the gap. If the contact angle of the working liquid with the insulating layer 14 is less than 120 degrees in these methods as explained above, it will be possible to efficiently wet the surface of the insulating layer 14, thus allowing more satisfactory attachment to be accomplished.

During attachment via the working liquid, care should be taken that all of the semiconductor film 22 does not elute into the working liquid. If all of the semiconductor film 22 elutes it will be difficult to form a homogeneous active layer 20. Elution of the semiconductor film 22 is preferably prevented by using a working liquid with a solubility parameter (SP value) different from the solubility parameter of the semiconductor film 22. A portion of the semiconductor film 22 may be dissolved during the attachment, as it is only essential that the entirety not be dissolved.

The pasting step completed in the manner described above may be followed by a removal step for removal of the unnecessary volatilizing components in the working liquid, if a working liquid is used. This bonds the semiconductor film 22 and insulating layer 14 together, yielding a transistor 100 of the first embodiment (FIG. 7(*d*)). In the removal step, the working liquid may be entirely removed or may partially remain. For example, all of the working liquid may be entirely removed so long as satisfactory adhesion is maintained between the insulating layer 14 and active layer 20.

The thickness of the active layer 20 in the transistor 100 is preferably at least 10 nm, more preferably at least 40 nm and even more preferably at least 200 nm. If the thickness of the active layer 20 is at least 10 nm it will be possible to obtain satisfactory transistor characteristics, and an active layer 20 of even greater thickness will aid in producing a transistor with even higher mobility. Increasing the thickness of the active layer 20 will also tend to prevent problems such as physical damage during fabrication. An active layer 20 with the desired thickness is achieved preferably by suitable adjustment of the thickness at the semiconductor film 22 stage. The preferred thickness for the active layer is the same for the second and third embodiments of transistors described hereunder.

The semiconductor film 22 was attached to the insulating layer 14 after stretching in the transistor production process of the first embodiment described above, but the transistor production process of the invention is not limited to this mode, and instead, the semiconductor film 22 may be stretched after attachment of the semiconductor film 22 and insulating layer 14. In this case, after the semiconductor film 22 and insulating layer 14 have been attached, for example, the entire laminated board 30 on which the semiconductor film 22 has been pasted may be stretched for stretching of the attached semiconductor film 22. Stretching may also be carried out both before and after attachment.

According to the invention, the semiconductor film 22 is more preferably attached to the insulating layer 14 after being stretched. In this case, stretching of the semiconductor film 22 beforehand will allow suitable adjustment of the orientation of the semiconductor film 22. Since heating and/or pressing are carried out in the pasting step according to the invention, the semiconductor film 22 can be satisfactorily pasted onto the insulating layer 14 even if the stretching procedure causes impairment of the adhesiveness of the semiconductor film 22 to the insulating layer 14 (such as distortion of the semiconductor film 22).

Orientation of the semiconductor film 22 by stretching is preferred as mentioned above to achieve superior carrier mobility, but orientation is not absolutely required. The carrier mobility of the transistor may be enhanced by means other than orientation, such as optimizing the shape of the semiconductor film 22 by stretching.

(Production Process for Transistor of Second Embodiment)

A preferred process for production of a transistor according to the second embodiment will now be explained.

Figure 8:
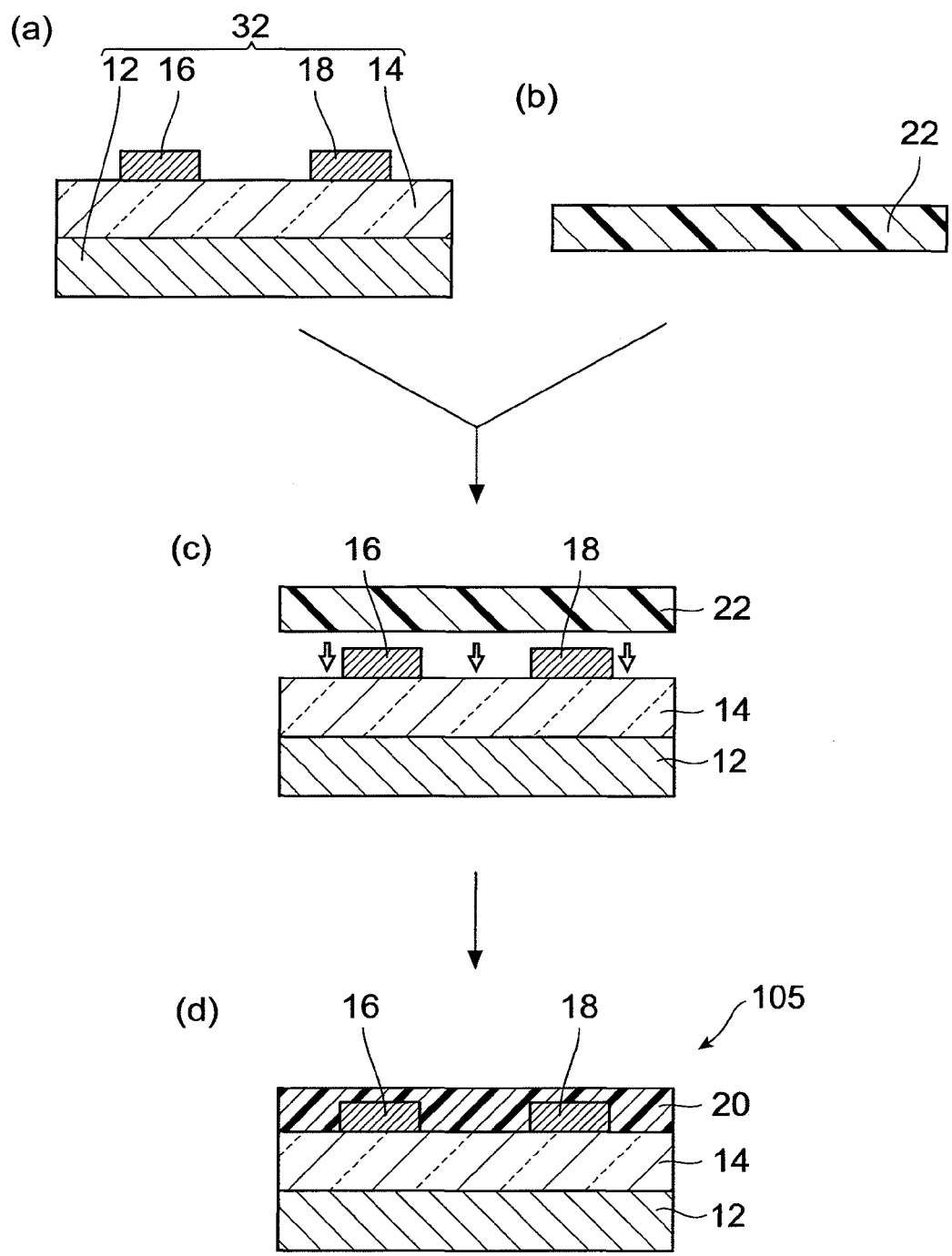
FIG. 8 is a process drawing for a transistor production process according to a second embodiment.

FIG. 8 is a process drawing for a transistor production process according to the second embodiment. In this production process, there is first prepared an element board 32 comprising a gate electrode 12, an insulating layer 14 formed on the gate electrode 12 and a source electrode 16 and drain electrode 18 formed on the insulating layer 14 (FIG. 8(a)). The gate electrode 12 also serves as the substrate in this case. A preferred example of such a gate electrode 12 is a metal base of highly-doped silicon or aluminum. The insulating layer 14 and the source and drain electrodes 16,18 may be formed in the same manner as the first embodiment.

During production of the element board 32 there is also prepared a semiconductor film 22 to serve as the organic semiconductor compound-containing active layer 20 (FIG. 8(b)). The semiconductor film 22 is then stretched in the same manner as the first embodiment. A pasting step is also performed in which the semiconductor film 22 and the insulating layer 14 of the element board 32 are attached while heating and/or pressing (FIG. 8(c)). When a working liquid is used in the pasting step, a removal step may also be carried out if necessary for removal of the unnecessary volatilizing components in the working liquid. This procedure yields a transistor 105 according to the second embodiment (FIG. 8(d)).

For the second embodiment as well, stretching of the semiconductor film 22 may be carried out before or after attachment to the insulating layer 14. In this case, after the unstretched semiconductor film 22 and insulating layer 14 have been attached, the entire element board 32 on which the semiconductor film 22 has been pasted is stretched in the prescribed direction.

(Production Process for Transistor of Third Embodiment)

A process for production of a transistor according to the third embodiment will now be explained.

FIG. 9 is a process drawing for a transistor production process according to the third embodiment. The material used to form the active layer in this production process is a laminated body obtained by attaching a semiconductor film 22 and support film 52.

In this embodiment, there is first prepared an element board 34 comprising a gate electrode 12, insulating layers 14 formed on both sides of the gate electrode 12, and a source electrode 16 and drain electrode 18 formed on one of the insulating layers 14 (FIG. 9(a)). Separately there is prepared a laminated body 50 (obtained by laminating the semiconductor film 22 on a support film 52), instead of the semiconductor film 22 of the first embodiment (FIG. 9(b)). The insulating layer 14 and the source electrode 16 and drain electrode 18 of the element board 34 may be formed in the same manner as for the first embodiment.

The support film 52 of the laminated body 50 may be composed of either an inorganic material or an organic material. Examples of such materials include polysiloxane, fluorine-based resin, polyethylene, polypropylene, methylpentene resin, polycarbonate, polyimide, polyamide, vinyl chloride, vinylidene chloride, acrylic resin, methacrylic resin, polystyrene, nylon, polyester and polyvinyl alcohol materials.

When the semiconductor film 22 is oriented before being attached to the insulating layer 14, the method may involve orientation of the semiconductor film 22 alone, or orientation after formation of the laminated body 50. In the latter case, the support film 52 is preferably one suitable for orientation by prescribed orienting operation. As examples of such support films 52 there may be mentioned polyethylene, polypropylene, methylpentene resin, polycarbonate, polyimide, polyamide, vinyl chloride, vinylidene chloride, methacrylic resin, nylon, polyester, polyvinyl alcohol and the like.

The support film 52 may be provided with a layer having a function of promoting release from the semiconductor film 22 laminated on the support film 52. As examples of such layers there may be mentioned layers with the function of converting light to heat, and layers that swell with heating. Such layers can promote release of the support film 52 and semiconductor film 22 by heat. When the support film 52 has such a layer, therefore, it may be exposed to light or heated after the pasting step in which the laminated body 50 and insulating layer 14 are attached, in order to facilitate release of the support film 52 from the active layer 20.

Also, providing the support film 52 with a layer having a function of converting light to heat or a layer that swells with heating may facilitate patterning of the active layer 20. Specifically, after the laminated body 50 has been pasted onto the insulating layer 14, a prescribed section of the semiconductor film 22 may be exposed to light through the support film 52 or to heating with a smoothing iron. This will cause the light-exposed or heated sections of the semiconductor film to be transferred onto the insulating layer 14 while allowing the other sections to be more easily peeled off with the support film 52. As a result, only the prescribed sections of the semiconductor film 22 will remain on the insulating layer 14, thus forming a patterned active layer 20.

The laminated body 50 can be formed, for example, by attachment of the support film 52 and the previously formed semiconductor film 22, or by direct addition of the organic semiconductor compound onto the support film 52 or direct coating of the organic semiconductor compound solution onto the support film 52. Direct addition of the organic semiconductor compound to the support film 52 may be accomplished by, for example in the case of a solid organic semiconductor compound, vapor deposition of the organic semiconductor compound, spray coating of its melt or sublimation onto the support film 52.

Direct coating of a solution of the organic semiconductor compound onto the support film 52 can be accomplished by, for example, spin coating, casting, microgravure coating, gravure coating, bar coating, roll coating, wire bar coating, dip coating, spray coating, screen printing, flexographic printing, offset printing, ink jet printing or the like.

When the semiconductor film 22 is oriented prior to pasting onto the insulating layer 14, it may be done so as the laminated body 50. Orientation may be carried out by uniaxial stretching, biaxial stretching, liquid imbibition stretching or the like, as for the first embodiment described above. In this case, the support film 52 will also be stretched along with the semiconductor film 22.

When the organic semiconductor compound of the semiconductor film 22 has a liquid crystal property, orientation of the semiconductor film 22 may by accomplished by another method known for orientation of liquid crystals instead of stretching. As examples of such methods there may be mentioned the methods described in Chapter 5 of "Ekisho no Kiso to Oyo" ["Liquid Crystal Fundamentals and Applications" (Matsumoto, S., Kakuta, I., 1991, Kogyo Chosakai Publishing), Chapter 7 of "Kyoindenseiekisho no Kozo to Bussei" ["Structures and Properties of Ferroelectric Liquid Crystals"] (Fukuda, A., Takezoe, H., 1990, Corona Publishing), and "Liquid Crystals", Vol. 3, No. 1 (1999) p. 3-16. These orienting methods may also be carried out instead of the stretching for the first and second embodiments described above, as well as for the fourth to sixth embodiments described hereunder.

Particularly convenient and useful orienting methods include rubbing, photoorientation, shearing (shear stress application) and pull-up coating methods.

Rubbing involves light abrasion of the support film 52 with a cloth or the like. The cloth used for abrasion of the support film 52 may be one made of gauze, polyester, cotton, nylon, rayon or the like. The cloth used for rubbing may be selected as appropriate for the film to be oriented. In this case, formation of a separate oriented film on the support film 52 can further increase the oriented performance. As such oriented films there may be mentioned polyimide, polyamide, polyvinyl alcohol, polyester and nylon films, and commercial liquid crystal oriented films may also be used. The oriented film can be formed by spin coating, flexographic printing or the like.

A photoorientation method is a method in which an orientation film is formed on the support film 52 and exposed to polarized UV light or oblique incident UV light to create an oriented function. As such oriented films there may be mentioned polyimide, polyamide and polyvinyl cinnamate films, and commercial liquid crystal oriented films may also be used.

Such rubbing or photoorientation methods allow orientation of the organic semiconductor compound (semiconductor film 22) laminated on the support film 52 that has been treated as described above. Orientation occurs as the organic semiconductor compound reaches its liquid crystal phase or isotropic phase temperature on the support film 52. The organic semiconductor compound can also be added to an already oriented support film 52 for orientation of the semiconductor film 22 on the support film 52.

When the organic semiconductor compound is coated onto the support film 52, the coating can be carried out by situating the organic semiconductor compound on the support film 52, setting the temperature to above its Tg or a temperature at which it exhibits a liquid crystal phase or isotropic phase, and coating in one direction using a rod or the like to accomplish orientation. Alternatively, a solution of the organic semiconductor compound in an organic solvent may be prepared and coated by spin coating or flexographic printing. Even if the organic semiconductor compound does not have a liquid crystal property, so long as it can be vapor deposited, it may be epitaxially vapor deposited on an oriented support film 52 to obtain a layer comprising the oriented organic semiconductor compound (semiconductor film 22).

Shearing is a method in which a separate substrate is placed over the organic semiconductor compound on the support film 52, and the upper substrate is shifted in one direction at a temperature below the liquid crystal phase or isotropic phase temperature of the organic semiconductor compound. If the support film 52 is a support layer that has been oriented by rubbing or photoorientation as mentioned above, an semiconductor film 22 with an even higher degree of orientation can be obtained. The upper substrate may be glass or a polymer film, or even a metal rod.

Pull-up coating is a method in which the support film 52 is immersed in a solution of an organic semiconductor compound and raised to form an oriented organic semiconductor compound layer (semiconductor film 22) on the support film 52. There are no particular restrictions on the organic solvent used for the organic semiconductor compound solution or the conditions such as the speed at which the support film 52 is raised, but these are preferably selected and adjusted according to the desired degree of orientation of the organic semiconductor compound.

While several methods for orienting the semiconductor film 22 were described above, stretching is the preferred method of orienting for all of the first to sixth embodiments, from the viewpoint of convenience and utility.

After preparing the element board 34 and laminated body 50, the pasting step is carried out, wherein the laminated body 50 and the insulating layer 14 of the element board 34 are attached while heating and/or pressing (FIG. 9(c)). The heating or pressing conditions may be the same as for the first embodiment. In addition to heating and/or pressing, the pasting step may also be carried out under reduced pressure for further enhanced adhesiveness and further accelerated removal of the working liquid.

The production process for a transistor according to the third embodiment may also include, for example, a removal step for removal of the unnecessary volatilizing components in the working liquid, when a working liquid is used in the pasting step. This yields a transistor 110 according to the third embodiment with the support film 52 laminated on the active layer 20 (FIG. 9(d)). Upon completing the transistor 110, the support film 52 may be removed or may be left if it does not interfere with practical use. When the support film 52 is left, the support film 52 is preferably one that also serves a function of protection from factors that can impair the characteristics of the active layer 20 (such as physical damage, effects of gas such as air, static electricity, etc.).

Either the step of orienting the semiconductor film 22 or the pasting step may be carried out first, as mentioned above, but when the semiconductor film 22 is oriented by a method other than stretching, the pasting step is preferably carried out using the oriented semiconductor film 22, obtained by first orienting the semiconductor film 22. This will help produce an active layer 20 with the desired orientation.

(Production Process for Transistor of Fourth Embodiment)

A process for production of a transistor according to the fourth embodiment will now be explained.

Figure 10:
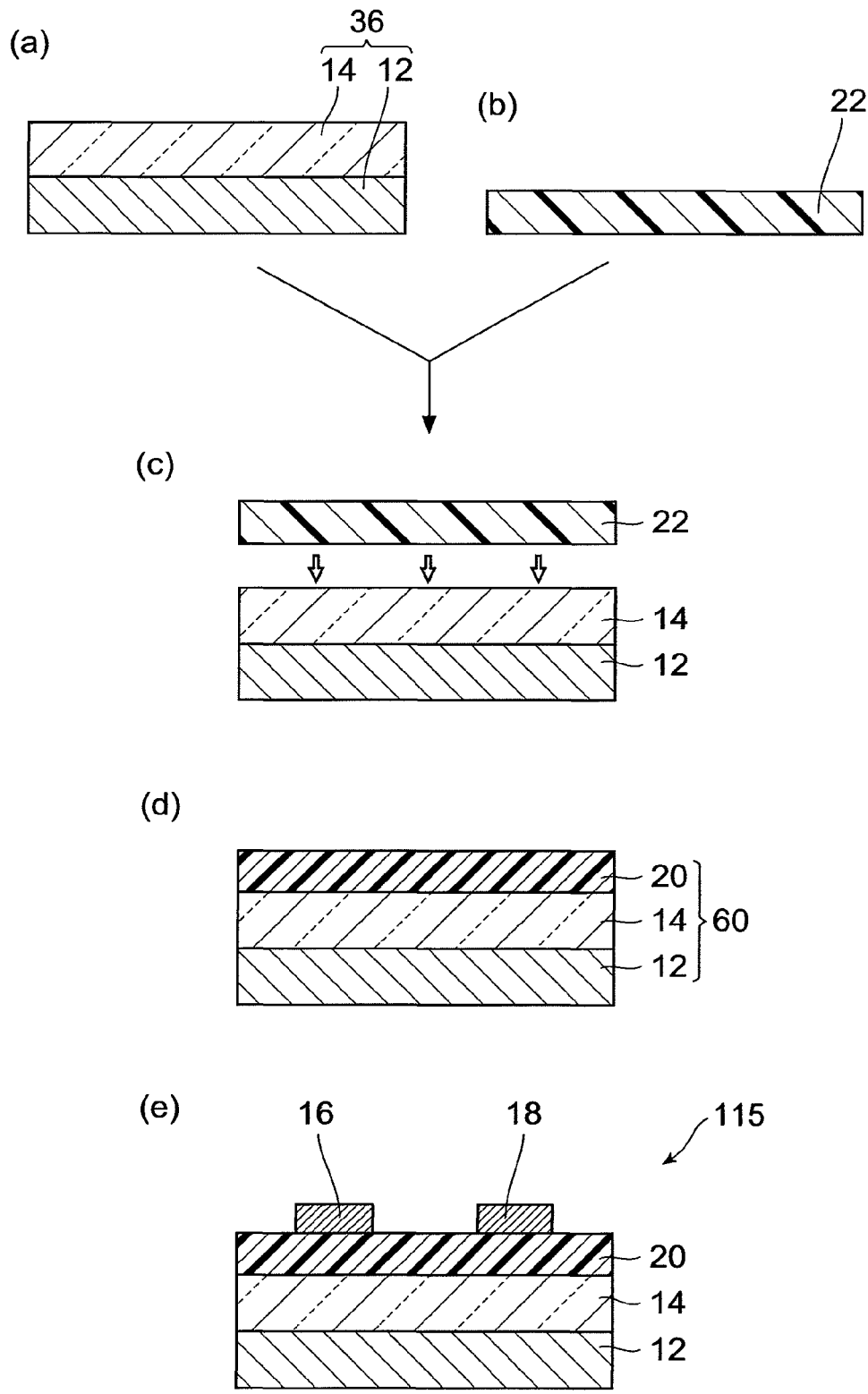
FIG. 10 is a process drawing for a transistor production process according to a fourth embodiment.

FIG. 10 is a process drawing for a transistor production process according to the fourth embodiment. In this production process, there is first prepared a first element board 36 comprising a gate electrode 12 and an insulating layer 14 formed thereon (FIG. 10(a)). The gate electrode 12 also serves as the substrate. The construction and production process for the gate electrode 12 and insulating layer 14 may be the same as for the second embodiment.

During production of the first element board 36 there is also prepared a semiconductor film 22 to serve as the organic semiconductor compound-containing active layer 20 (FIG. 10(b)). Stretching of the semiconductor film 22 or other orienting treatment is then carried out as appropriate. This is followed by a pasting step in which the semiconductor film 22 and the insulating layer 14 of the first element board 36 are attached while heating and/or pressing (FIG. 10(c)). This procedure produces a second element board 60 having the active layer 20 formed on the element board 36 (FIG. 10(d)). In the pasting step, a laminated body 50 according to the third embodiment may be used instead of the semiconductor film 22. In this case, the pasting is followed by the procedure described below for removal of the support film 52 of the laminated body 50.

A source electrode 16 and drain electrode 18 are formed on the active layer 20 of the second element board 60 in the same manner as the first embodiment, to obtain a transistor 115 according to the fourth embodiment (FIG. 10(e)).

For production of the transistor of the fourth embodiment as well, stretching or other orienting treatment of the semiconductor film 22 may be carried out either before or after pasting the semiconductor film 22.

(Production Process for Transistor of Fifth Embodiment)

A preferred process for production of a transistor according to the fifth embodiment will now be explained.

Figure 11:
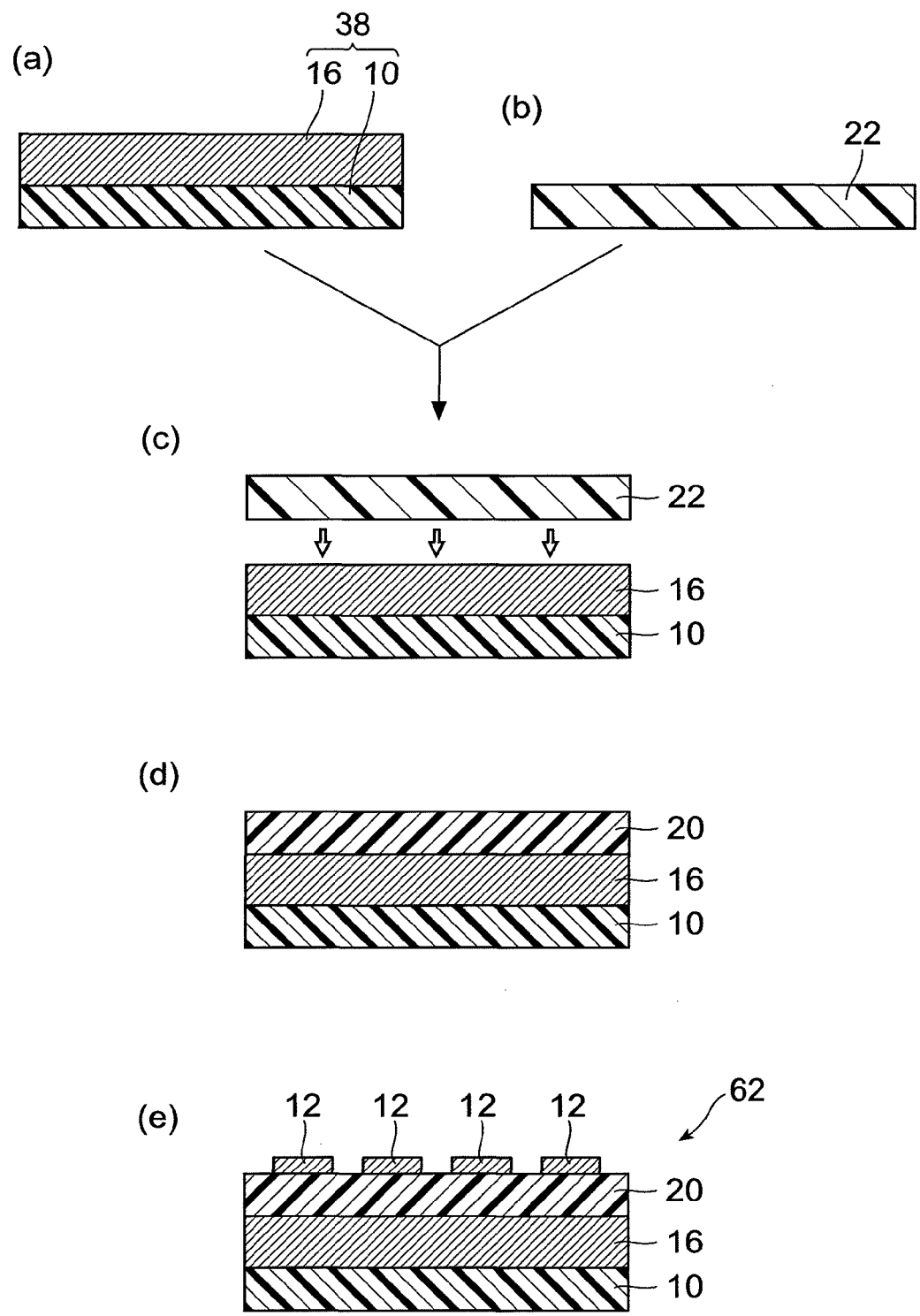
FIG. 11 is a process drawing for a transistor production process according to a fifth embodiment.
Figure 12:
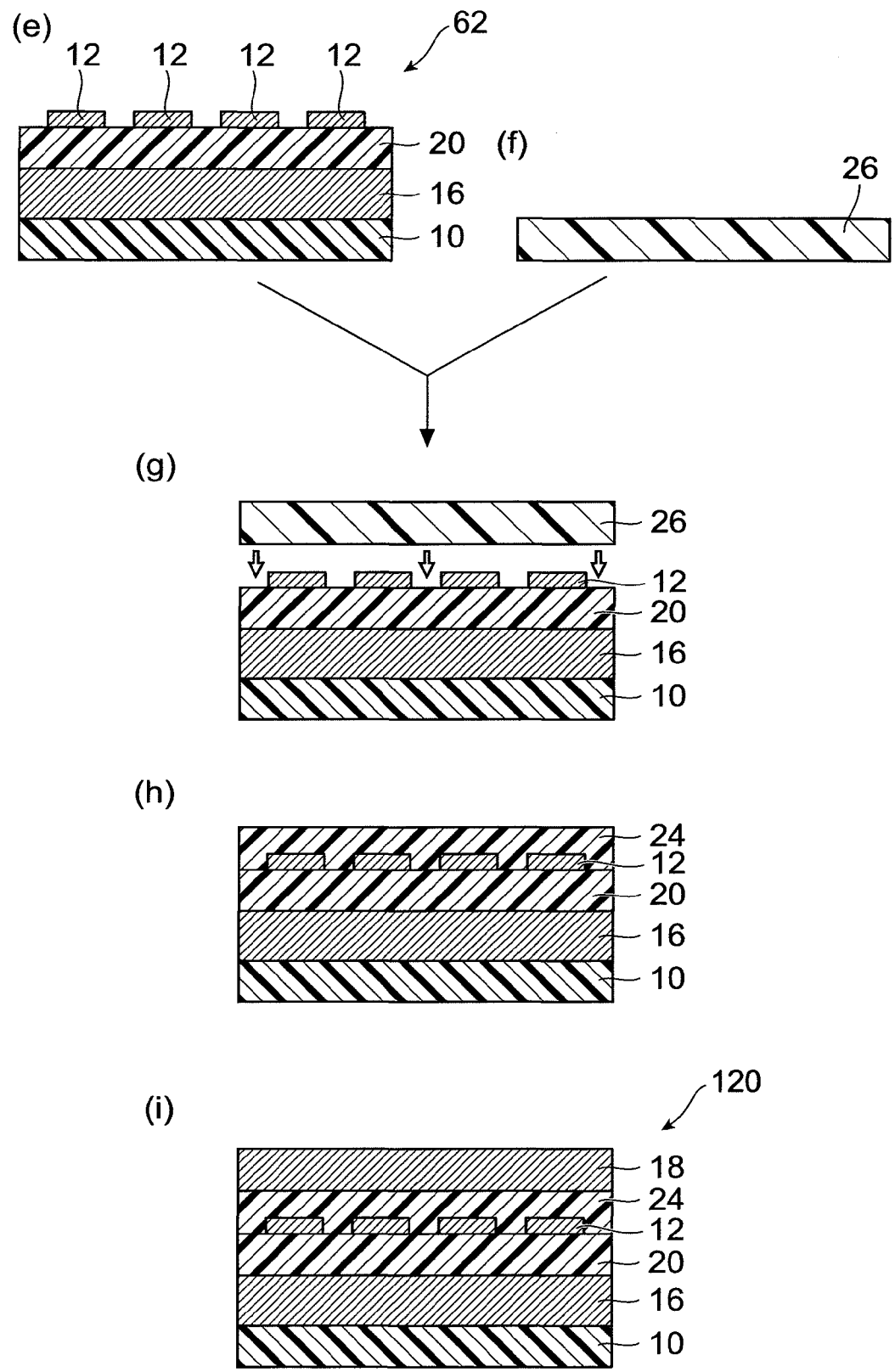
FIG. 12 is a process drawing for a transistor production process according to the fifth embodiment.

FIGS. 11 and 12 are process drawings for a transistor production process according to the fifth embodiment. In this production process there is first prepared a first element board 38 comprising a substrate 10 and a source electrode 16 formed thereon (FIG. 11(a)).

Separately, there is prepared a semiconductor film 22 which is to serve as the organic semiconductor compound-containing active layer 20 (FIG. 11(b)), and this semiconductor film 22 is subjected to stretching or other orienting treatment. This is followed by a first pasting step in which the semiconductor film 22 and the source electrode 16 of the first element board 38 are attached while heating and/or pressing (FIG. 11(c)). The first pasting step may be carried out in the same manner as for the first embodiment. The semiconductor film 22 is bonded to the first element board 38 and an active layer 20 is formed from the semiconductor film 22 (FIG. 11(d)).

Next, a plurality of gate electrodes 12 (four in this case) are formed on the active layer 20 on the first element board 38 to obtain a second element board 62 (FIG. 11(e)). The gate electrodes 12 used may be the same as for the first embodiment.

With the second element board 62 (FIG. 12(e)) there is separately prepared a semiconductor film 26 which is to serve as the organic semiconductor compound-containing active layer 24 (FIG. 12(f)). This semiconductor film 26 is also subjected to stretching or other orienting treatment, as appropriate. The organic semiconductor compound in the semiconductor film 26 may be the same as or different from that in the active layer 20 described above.

A second pasting step is then carried out, in which the semiconductor film 26 and the active layer 20 of the second laminated board 62 are attached while heating and/or pressing (FIG. 12(g)). The semiconductor film 26 is thus pasted on the active layer 20 so as to cover the gate electrode 12. The second pasting step may also be carried out in the same manner as for the first embodiment. A working liquid may be used in the first and second pasting steps as for the embodiments described above, in which case the same or a different working liquid may be used.

The second pasting step accomplishes bonding of the semiconductor film 26 to the active layer 20 over the gate electrode 12, to form an active layer 24 (FIG. 12(h)). A drain electrode 18 is formed on the obtained active layer 24 in the same manner as the first embodiment, to obtain a transistor 120 according to the fifth embodiment. (FIG. 12(i)). In the process for production of a transistor according to the fifth embodiment, either or both the active layers 20 and 24 may be formed by the process described in Japanese Unexamined Patent Publication No. 2004-006476, for example. In the first or second pasting step, a laminated body 50 according to the third embodiment may be used instead of the semiconductor film 22. In this case, the procedure following pasting is carried out after removing the support film 52 of the laminated body 50.

In the transistor production process of the fifth embodiment described above, both of the semiconductor films 22 and 26 used to form the active layers 20 and 24 were subjected to orienting treatment such as stretching, but there is no limitation to this mode, as the carrier mobility can be improved even with stretching of only one of the semiconductor films. Also, for this embodiment, orienting treatment such as stretching may be carried out on the pasted board (for example, the first element board 38 or second element board 62) obtained after pasting of the unstretched semiconductor films 22,26 in each pasting step. Alternatively, one of the semiconductor films may be pasted before stretching and the other semiconductor film pasted after stretching.

(Production Process for Transistor of Sixth Embodiment)

A preferred process for production of a transistor according to the sixth embodiment will now be explained.

Figure 13:
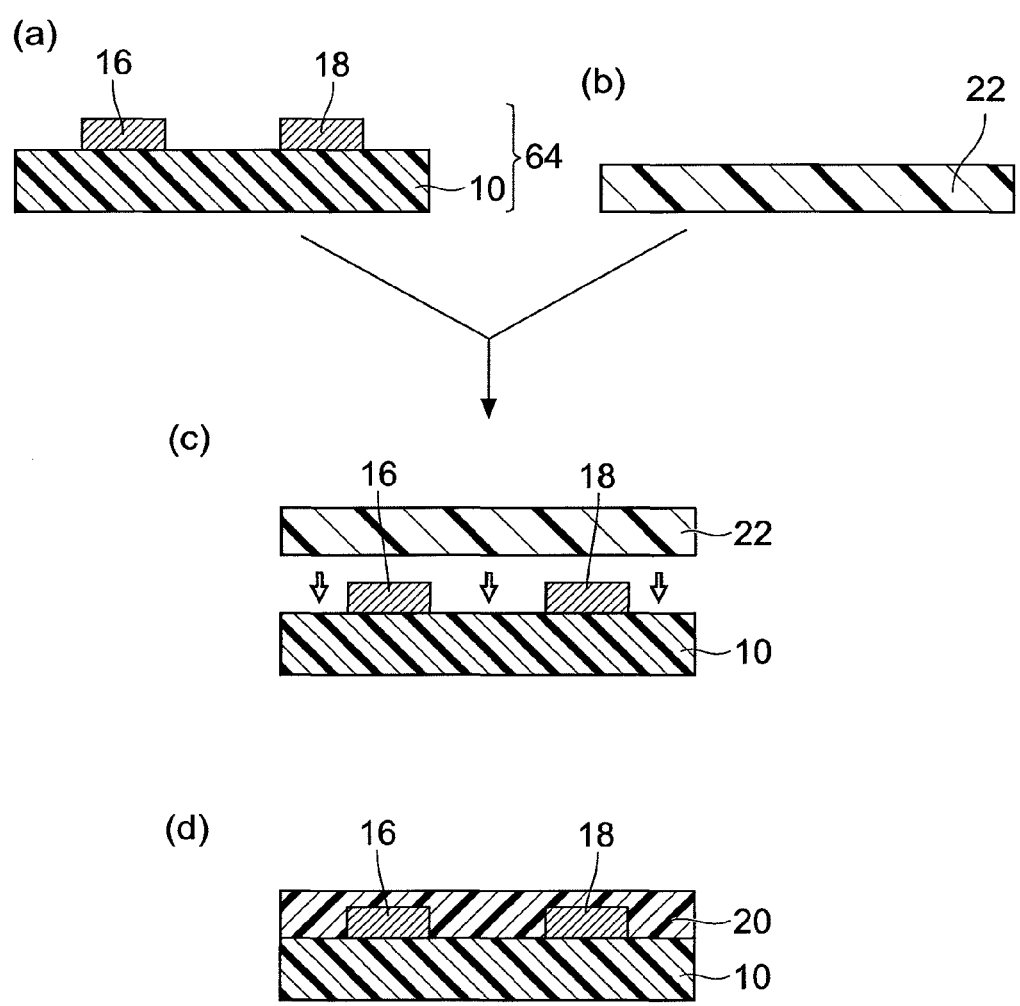
FIG. 13 is a process drawing for a transistor production process according to a sixth embodiment.

FIGS. 13 and 14 are process drawings for a transistor production process according to the sixth embodiment. In this production process, there is first prepared an element board 64 comprising a substrate 10 and a source electrode 16 and drain electrode 18 formed thereon (FIG. 13(a)). The source electrode 16 and drain electrode 18 may be formed in the same manner as the first embodiment.

During production of the element board 64 there is also prepared a semiconductor film 22 to serve as the organic semiconductor compound-containing active layer 20 (FIG. 13(b)). The aforementioned stretching or other orienting of the semiconductor film 22 is then carried out as appropriate. A pasting step is also performed in which the stretched or oriented semiconductor film 22 and the substrate 10 of the element board 64 are attached while heating and/or pressing (FIG. 13(c)). This results in formation of an active layer 20 on the substrate 10 covering the source electrode 16 and drain electrode 18 (FIG. 13(d)).

An insulating layer 14 is then formed on the active layer 20 in the same manner as for the first embodiment (FIG. 14(e)). A gate electrode 12 is formed on the obtained insulating layer 14 in the same manner as for the first embodiment, to obtain a transistor 125 according to the sixth embodiment (FIG. 14(f)).

For production of a transistor according to the sixth embodiment as well, a laminated body 50 according to the third embodiment may be used instead of the semiconductor film 22. In this case, the procedure following pasting is carried out after removal of the support film 52 of the laminated body 50. When the support film 52 also has a function as an insulating layer 14, it may be used as the insulating layer 14 and does not need to be removed.

The transistors and production processes according to the first to sixth embodiments were explained above as examples of organic semiconductor elements and their production processes, but a transistor and production process according to the invention is not necessarily limited to the embodiments described above and may incorporate modifications as deemed suitable.

For example, the active layer 20 of the transistor of each embodiment (the active layers 20 and 24 in the case of the fifth embodiment) do not need to be single layers and may instead comprise multiple layers. When the active layers 20,24 are multiple layers, these multiple layers may be composed of the same material or of different materials. Such active layers 20,24 composed of multiple layers may be formed by further laminating the same or diverse semiconductor films on the semiconductor films 22,26 used to form the active layers 20,24, if necessary after removing the support film remaining thereover.

Furthermore, all of the embodiments described above have constructions with the source electrode 16 or drain electrode 18 directly bonded to the active layer 20 or 24, but there is no limitation to such a construction and instead, a layer composed of a compound different from the organic semiconductor compound may intervene between the source electrode 16 and/or drain electrode 18 and the active layers 20,24. This can reduce contact resistance between the source electrode 16 and drain electrode 18 and the active layers 20,24, thus further enhancing the carrier mobility of the transistor. As compounds different from organic semiconductor compounds there may be mentioned donor compounds, acceptor compounds and thiol group-containing compounds.

As donor compounds there may be mentioned tetrathiafulvalene, tetramethyltetrathiafulvalene and tetraselenathiafulvalene; amine compounds such as diphenylphenylenediamine, tetraphenylphenylenediamine, tetraphenyldiaminodiphenyl and polyvinylcarbazole; alkali metals, alkaline earth metals, rare earth metals, and complexes of such metals with organic compounds.

As acceptor compounds there may be mentioned halogens such as iodine, bromine, chlorine, iodine chloride and iodine bromide; sulfur oxide compounds such as sulfuric acid, sulfuric anhydride, sulfur dioxide and sulfuric acid salts; nitrogen oxide anhydrides such as nitric acid, nitrogen dioxide and nitric acid salts; halogenated compounds such as perchloric acid and hypochlorous acid; acids such as tetrafluoroboric acid, tetrafluoroboric acid salts, phosphoric acid, phosphoric acid salts, trifluoroacetic acid and their salts; and tetracyanoquinodimethane, tetrachlorotetracyanoquinodimethane, tetrafluorotetracyanoquinodimethane, tetracyanoethylene, dichlorocyanoethylene, dichlorodicyanoquinone, tetrachloroquinone and the like.

As thiol group-containing compounds there may be mentioned alkylthiol compounds such as alkylthiols, and fluorinated alkylthiols; and aromatic thiol compounds such as aromatic thiols, fluorinated alkylaromatic thiols, fluorinated aromatic thiols, nitroaromatic thiols and aminoaromatic thiols.

A layer composed of such a compound may be formed by, for example, contacting the surface of the source electrode 16 or drain electrode 18 with a solution or gas containing the compound to adsorb the compound onto the contact surface.

There are no particular restrictions on the thicknesses of the source electrode 16 and drain electrode 18 in the transistor of each of the aforementioned embodiments. However, when the active layer 20 or 24 is formed on the source electrode 16 or drain electrode 18 as according to the first to third and fifth embodiments, the source electrode 16 and drain electrode 18 are preferably as thin as possible within a functionable range as electrodes, in order to achieve more satisfactory adhesiveness with the active layers 20,24.

The transistors of the first to sixth embodiments may also be sealed transistors, obtained by sealing after completing the element structure described above. This will shield the transistor from air while also protecting it from physical damage, thus helping to avoid loss of the transistor characteristics.

The sealing method may be a method in which the element structure is covered with an insulating polymer, UV curing resin, thermosetting resin or inorganic silicon oxide film or silicon nitride film, or a method in which a glass plate or a film is attached to the element structure using an UV curing resin, thermosetting resin or the like. For effective shielding from air, the steps after fabrication of the transistor and before sealing are preferably carried out without exposure to air (for example, in a dry nitrogen atmosphere or in a vacuum).

The transistor as described above may be satisfactorily utilized in semiconductor devices. As semiconductor devices there may be mentioned wireless tags, displays, large-area sensors and the like. A logic circuit may be constructed in the semiconductor device using the transistor, for example, either alone or in combination with other transistors. More specifically, the invention is suitable for semiconductor devices such as display pixel switching transistors, signal driver circuit elements, memory circuit elements, signal processing unit elements and the like. Other applications are numerous and include electronic paper, liquid crystal or organic LEDs and other displays.

EXAMPLES

The present invention will now be explained in greater detail based on examples and comparative examples, with the understanding that these examples are in no way limitative on the invention.

<Organic Semiconductor Compound>

Poly(3-hexylthiophene) and poly(3-octylthiophene) were purchased from Aldrich Co. These poly(3-hexylthiophene) and poly(3-octylthiophene) used were regioregular compounds.

[Formation of Transistor, and Evaluation of its Physical Properties]

Transistors according to Examples 1-3 and according to Comparative Examples 1-5 were fabricated by the steps shown in FIGS. 15 and 16, respectively, and the characteristics of the obtained transistors were evaluated.

Example 1

Production of Transistor (1) Fabrication of Element Board

Figure 15:
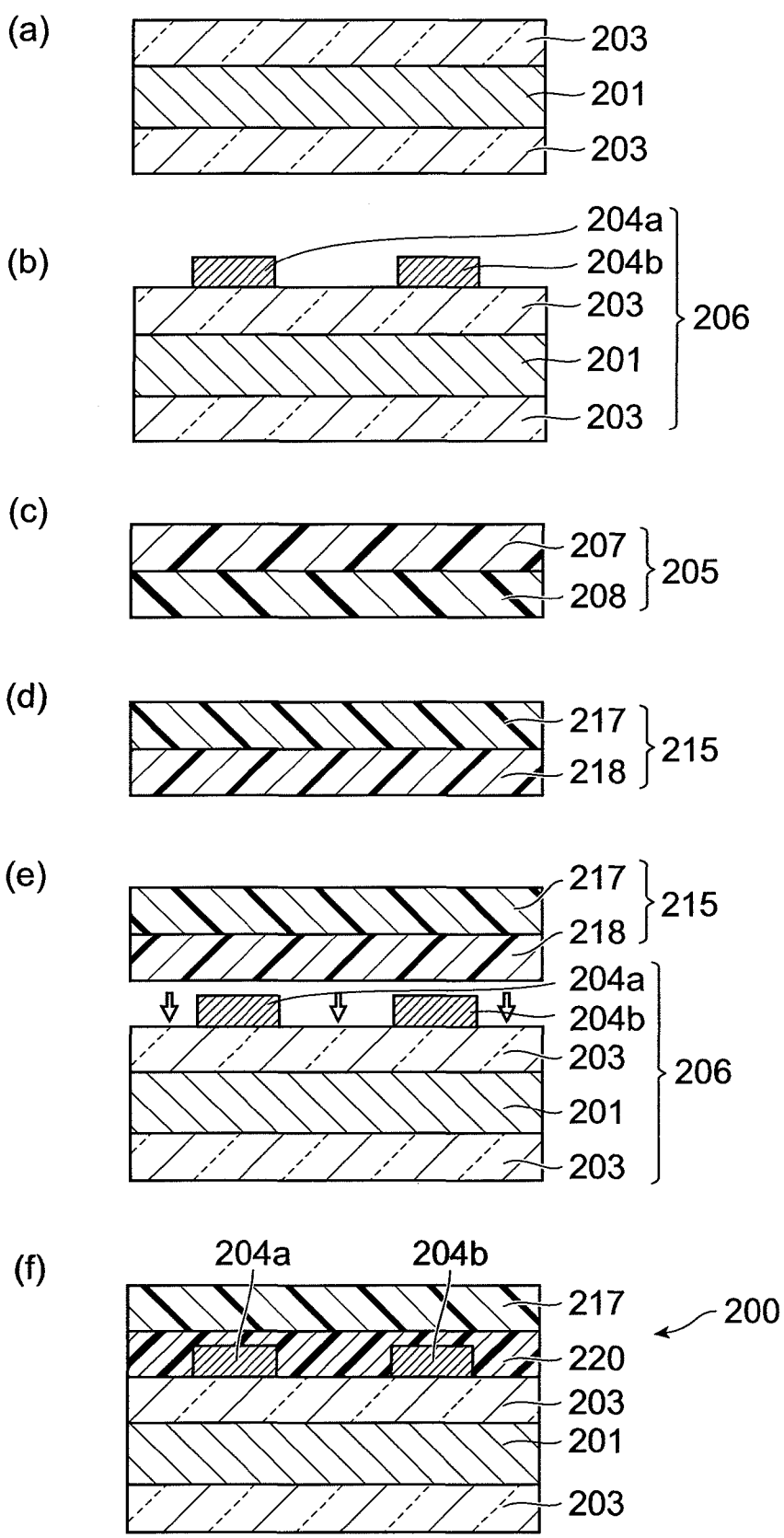
FIG. 15 is a drawing illustrating the production steps for the transistors of Examples 1 to 3.

First, as shown in FIG. 15(a), the surface of a highly doped n-type silicon substrate 201 as the substrate/gate electrode was subjected to thermal oxidation to form 200 nm silicon oxide films as insulating layers 203, for use as a support substrate. Next, as shown in FIG. 15(b), the surface of one of the insulating layers 203 of the substrate 201 was subjected to vacuum vapor deposition for deposition of gold to a thickness of 65 nm, to form a source electrode 204a and drain electrode 204b with lead wires and pads. The channel width of the electrodes was 500 μm and the channel length was 20 μm.

Next, using a method described in the literature (S. R. Wasserman, et al., Langmuir, Vol. 5, p1074, 1989), the surface of the insulating layer 203 was modified by immersion in an octyltrichlorosilane octane solution (6 mmol/l) to form an element board 206.

(2) Fabrication of Stretched Laminated Body

A different laminated body for formation of the active layer was prepared separately from the element board 206. First, a poly(3-hexylthiophene) chloroform solution (2.0 wt %) was prepared in air.

Next, as shown in FIG. 15(c), the poly(3-hexylthiophene) chloroform solution was coated onto the polyethylene film serving as the support film 207 by spin coating (1000 rpm) in a glove box with a nitrogen atmosphere. This formed a laminated body 205 comprising the poly(3-hexylthiophene) film 208 laminated on the polyethylene support film 207.

The laminated body 205 was then subjected to uniaxial stretching to a factor of 2.5 in a nitrogen atmosphere at 100° C. This yielded a stretched laminated body 215 comprising the stretched support film 217 and the stretched poly(3-hexylthiophene) film 218 (FIG. 15(d)).

The oriented state of the poly(3-hexylthiophene) film 218 of the stretched laminated body 215 was confirmed in the following manner. First, a section of the stretched laminated body 215 was cut and contact bonded with a glass slide heated to 60° C. on a hot plate, with the poly(3-hexylthiophene) film 218 in contact therewith. The support film 217 alone was then released with tweezers to transfer the poly(3-hexylthiophene) film 218 onto the glass slide. The transferred poly(3-hexylthiophene) film 218 was observed with a polarizing microscope. As a result, the poly(3-hexylthiophene) film 218 was confirmed to be oriented in the stretched direction of the laminated body 205.

(3) (Fabrication of Transistor)

Next as shown in FIG. 15(e), the stretched laminated body 215 was placed on the insulating layer 203 on which a source electrode 204a and drain electrode 204b had been formed, using tweezers with the poly(3-hexylthiophene) film 218 facing the insulating layer 203 on which the source electrode 204a and drain electrode 204b had been formed. The top surface of the stretched laminated body 215 was then very lightly rubbed with BENCOTTON (Asahi Kasei Corp.). The stretching direction of the stretched laminated body 215 was parallel to the direction in which the source electrode 204a and drain electrode 204b were connected.

The element board 206 on which the stretched laminated body 215 had been placed was then heated with a hot plate in a nitrogen atmosphere at 80° C. for 40 minutes. A transistor 200 for Example 1 was thus obtained (FIG. 15(f)).

(Measurement of I-V Characteristic)

To the obtained transistor there was applied a gate voltage $V_G$ of +50 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $1.7 \times 10^{-2}$ cm²/Vs.

Example 2

Production of Transistor

A transistor 200 for Example 2 was obtained in the same manner as Example 1, except that after placing the stretched laminated body 215 on the element board 206 during fabrication of the transistor in (3) above, a load of 0.47 kg/cm² was applied and heating was performed with a hot plate in a nitrogen atmosphere at 80° C. for 40 minutes and then at 90° C. for 45 minutes.

(Measurement of I-V Characteristic)

To the obtained transistor there was applied a gate voltage $V_G$ of +50 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $2.8 \times 10^{-2}$ cm²/Vs.

Example 3

Production of Transistor

A transistor 200 for Example 3 was obtained in the same manner as Example 1, except that the only procedure after placing the stretched laminated body 215 on the element board 206 during fabrication of the transistor in (3) above was application of a load of 2.7 kg/cm² for 30 minutes in a nitrogen atmosphere.

(Measurement of I-V Characteristic)

To the obtained transistor there was applied a gate voltage $V_G$ of +50 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $8.1 \times 10^{-3}$ cm²/Vs.

Comparative Example 1

Production of Transistor

A transistor 200 for Comparative Example 1 was obtained in the same manner as Example 1, except that the element board 206 on which the stretched laminated body 215 had been placed was not heated during fabrication of the transistor in (3) above.

(Measurement of I-V Characteristic)

To the obtained transistor there was applied a gate voltage $V_G$ of +50 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $2.0 \times 10^{-3}$ cm²/Vs.

Comparative Example 2

Production of Transistor (1) Fabrication of Element Board

First, an element board 206 was obtained in the same manner as Example 1 by the production steps illustrated in FIGS. 15(a) and (b).

(2) Fabrication of Laminated Body

A laminated body for formation of the active layer was also prepared as shown in FIG. 15(c), separately from the element board 206. First, a poly(3-hexylthiophene) chloroform solution (2.0 wt %) was prepared in air.

The poly(3-hexylthiophene) chloroform solution was then coated by spin coating (1000 rpm) onto the polyethylene film as the support film 207 in a glove box with a nitrogen atmosphere. This formed a laminated body 205 comprising the poly(3-hexylthiophene) film 208 laminated on the polyethylene support film 207. In Comparative Example 2, the laminated body 205 was not stretched and was cut to an appropriate size for use in fabrication of a transistor.

(3) (Fabrication of Transistor)

As shown in FIG. 16(a), the laminated body 205 was placed on the insulating layer 203 on which the source electrode 204a and drain electrode 204b had been formed, using tweezers with the poly(3-hexylthiophene) film 208 facing the insulating layer 203 on which the source electrode 204a and drain electrode 204b had been formed. The top surface of the laminated body 205 was then very lightly rubbed with BEN-COTTON (Asahi Kasei Corp.).

The element board 206 on which the laminated body 205 had been placed was then heated with a hot plate in a nitrogen atmosphere at 80° C. for 40 minutes. A transistor 210 for Comparative Example 2 with an unstretched active layer 228 made of poly(3-hexylthiophene) was thus obtained (FIG. 16(b)).

(Measurement of I-V Characteristic)

To the obtained transistor there was applied a gate voltage $V_G$ of +50 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $1.1 \times 10^{-2}$ cm$^2$/Vs.

Comparative Example 3

Production of Transistor

A transistor 210 for Comparative Example 3 with an unstretched active layer 228 made of poly(3-hexylthiophene) was obtained in the same manner as Comparative Example 2, except that after placing the laminated body 205 on the element board 206 during fabrication of the transistor in (3) (FIG. 16(a)), a load of 0.47 kg/cm$^2$ was applied and a hot plate was used for heating in a nitrogen atmosphere at 80° C. for 40 minutes and at 90° C. for 45 minutes.

(Measurement of I-V Characteristic)

To the obtained transistor there was applied a gate voltage $V_G$ of +40 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $2.0 \times 10^{-2}$ cm$^2$/Vs.

Comparative Example 4

Production of Transistor

A transistor 210 for Comparative Example 4 with an unstretched active layer 228 made of poly(3-hexylthiophene) (FIG. 16(b)) was obtained in the same manner as Comparative Example 2, except that the only procedure after placing the laminated body 205 on the element board 206 during fabrication of the transistor in (3) (FIG. 16(a)) was application of a load of 2.7 kg/cm$^2$ for 30 minutes in a nitrogen atmosphere.

(Measurement of I-V Characteristic)

To the obtained transistor there was applied a gate voltage $V_G$ of +50 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $7.6 \times 10^{-3}$ cm$^2$/Vs.

Comparative Example 5

Production of Transistor

A transistor 210 for Comparative Example 5 was obtained in the same manner as Comparative Example 1, except that no heating was carried out after placing the laminated body 205 on the element board 206 (FIG. 16(a)) during fabrication of the transistor in (3) above.

(Measurement of I-V Characteristic)

To the obtained transistor there was applied a gate voltage $V_G$ of +50 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $5.7 \times 10^{-3}$ cm$^2$/Vs.

Example 4

Production of Transistor

Figure 17:
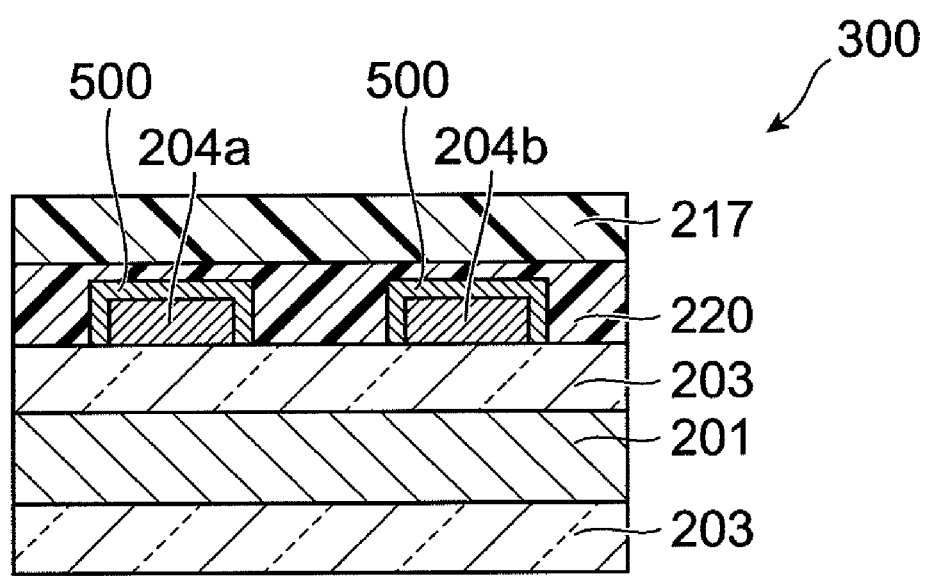
FIG. 17 is a schematic cross-sectional view of the transistor obtained in Example 4.

A transistor was produced in the same manner as Example 1 except that the element board used was an element board 216 further comprising a 4-(trifluoromethyl)thiophenol layer 500 formed on the source electrode 204a and drain electrode 204b of the element board 206 (see FIG. 18), to obtain a transistor 300 comprising a 4-(trifluoromethyl)thiophenol layer 500 between the source electrode 204a and drain electrode 204b and the active layer 220, as shown in FIG. 17. The 4-(trifluoromethyl)thiophenol layer 500 was formed after the element board 206, by dipping the latter in a 4-(trifluoromethyl)thiophenol ethanol solution (1 mmol/L) for 0.5 hour.

(Measurement of I-V Characteristic)

To the obtained transistor there was applied a gate voltage $V_G$ of +40 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $4.1 \times 10^{-2}$ cm$^2$/Vs.

Comparative Example 6

Production of Transistor

A transistor was obtained in the same manner as Example 4, except that an unstretched laminated body 205 similar to Comparative Example 2 was used instead of the stretched laminated body 215 during production of the transistor in (3) above. A transistor for Comparative Example 6 was thus obtained, having a structure similar to that of the transistor 300 of Example 4 except for having the unstretched active layer 228 and unstretched support film 207 instead of the active layer 220 and stretched support film 217, respectively.

(Measurement of I-V Characteristic)

To the obtained transistor there was applied a gate voltage $V_G$ of +40 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $2.7 \times 10^{-2}$ cm$^2$/Vs.

Example 5

Production of Transistor (1) Fabrication of Element Board

Figure 18:
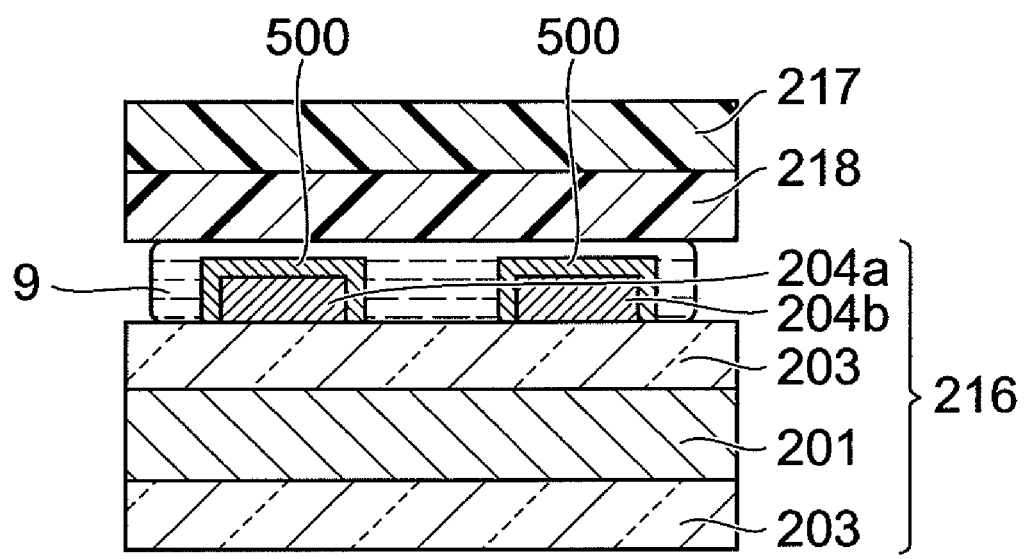
FIG. 18 is a drawing illustrating some of the production steps for the transistor of Example 6.

First, an element board 206 was fabricated in the same manner as Example 1, and then a 4-(trifluoromethyl)thiophenol layer 500 was also formed in the same manner as Example 4 on the source electrode 204a and drain electrode 204b to obtain an element board 216 (FIG. 18).

(2) Fabrication of Stretched Laminated Body

A stretched laminated body 215 was obtained in the same manner as Example 1.

(3) Fabrication of Transistor

Next, as shown in FIG. 18, a drop of methanol as the working liquid 9 was placed on the insulating layer 203 of the element board 216 using a dropper, and the stretched laminated body 215 was set over the working liquid 9 with the poly(3-hexylthiophene) film 218 facing the insulating layer 203 on which the source electrode 204a and drain electrode 204b had been formed. The stretching direction of the stretched laminated body 215 was parallel to the direction in which the source electrode 204a and drain electrode 204b were connected. The laminated body was allowed to stand until the methanol working liquid 9 dried off. This resulted in natural bonding of the stretched laminated body 215 on the insulating layer 203, covering the source electrode 204a and drain electrode 204b. Next, heat treatment was performed at 80° C. for 40 minutes in the same manner as Example 4. This yielded a transistor for Example 5 having the same structure as the transistor 300 of Example 4.

(Measurement of I-V Characteristic)

To the obtained transistor there was applied a gate voltage $V_G$ of +40 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $1.2 \times 10^{-1}$ cm$^2$/Vs.

Comparative Example 7

Production of Transistor

A transistor was obtained in the same manner as Example 5, except that an unstretched laminated body 205 similar to Comparative Example 2 was used instead of a stretched laminated body 215 during production of the transistor in (3) above. This yielded a transistor for Comparative Example 7 having the same structure as Comparative Example 6, with the unstretched active layer 228 formed by attachment via the working liquid 9.

(Measurement of I-V Characteristic)

To the obtained transistor there was applied a gate voltage $V_G$ of +40 to −40 V and a source-drain voltage $V_{SD}$ of −40 V in a nitrogen atmosphere, using a silicon substrate 201 as the gate electrode, and the transistor characteristics were measured. The mobility obtained from the I-V characteristic was $8.8 \times 10^{-2}$ cm$^2$/Vs.

The characteristics of the transistors obtained in Example 1-5 and Comparative Example 1-7 are summarized in Table 1 and Table 2. Table 1 shows the characteristics obtained with the transistors of Examples 1-5 and Comparative Example 1 produced by stretching the semiconductor films used to form the active layers, and Table 2 shows the characteristics obtained with the transistors of Comparative Examples 2-7 where the semiconductor films were not stretched. The values for mobility increase in the tables are all values for the increase in mobility with heating and/or pressing calculated based on 100% as the mobility of a transistor obtained without heating or pressing during formation of the active layer.

TABLE 1

| | Active layer forming conditions | With 4-(trifluoromethyl)thiophenol layer | Mobility (cm$^2$/Vs) | Mobility increase (%) |
|---|---|---|---|---|
| Comp. Ex. 1 | No heating or pressing | — | $2.0 \times 10^{-3}$ | 100 |
| Example 1 | Heating | — | $1.7 \times 10^{-2}$ | 874 |
| Example 2 | Heating and pressing | — | $2.8 \times 10^{-2}$ | 1402 |
| Example 3 | Pressing | — | $8.1 \times 10^{-3}$ | 408 |
| Example 4 | Heating | + | $4.1 \times 10^{-2}$ | 2055 |
| Example 5 | Heating and working liquid | + | $1.2 \times 10^{-1}$ | 5779 |

TABLE 2

| | Active layer forming conditions | With 4-(trifluoromethyl)thiophenol layer | Mobility (cm$^2$/Vs) | Mobility increase (%) |
|---|---|---|---|---|
| Comp. Ex. 5 | No heating or pressing | — | $5.7 \times 10^{-3}$ | 100 |
| Comp. Ex. 2 | Heating | — | $1.1 \times 10^{-2}$ | 200 |
| Comp. Ex. 3 | Heating and pressing | — | $2.0 \times 10^{-2}$ | 357 |
| Comp. Ex. 4 | Pressing | — | $7.6 \times 10^{-3}$ | 134 |
| Comp. Ex. 6 | Heating | + | $2.7 \times 10^{-2}$ | 480 |
| Comp. Ex. 7 | Heating and working liquid | + | $8.8 \times 10^{-2}$ | 1546 |

The data in Table 1 and Table 2 indicate that the transistors of Examples 1-5 that comprised stretching-oriented semiconductor films for formation of the active layers had notably improved mobility due to heating and/or pressing during formation of the active layers, and as a result exhibited superior transistor characteristics.

Also, given the same active layer forming conditions, as in Example 1 and Comparative Example 2, Example 2 and Comparative Example 3, and Example 3 and Comparative Example 4, the transistor of the example with stretching had higher mobility and superior transistor characteristics compared to the one without stretching. Furthermore, comparing Comparative Example 1 with Comparative Example 5 confirmed that stretching alone does not result in the same improvement in mobility achieved when it is in combination with heating or pressing. In addition, even greater improvement in mobility was achieved by providing a 4-(trifluoromethyl)thiophenol layer between the source and drain electrodes and the active layer as in Example 4, and by attaching them with a working liquid as in Example 5. Moreover, comparison of Comparative Examples 6 and 7 demonstrates that the aforementioned effect is vastly superior with a stretched active layer as compared to an unstretched one.

Examples 6-11

Production of Transistor

Transistors for Examples 6-11 were produced in the same manner as Example 1, except that for fabrication of the stretched laminated body in (2) above, poly(3-octylthiophene) was used instead of poly(3-hexylthiophene), the laminated body 205 was uniaxially stretched to a factor of 3.5, and the heating time was 1 hour. For Examples 6-11, poly(3-octylthiophene) films 208 having different film thicknesses were formed by varying the poly(3-octylthiophene) chloroform solution concentration used for formation of the laminated body 5, to obtain transistors having active layers 220 with different film thicknesses.

(Measurement of I-V Characteristic)

To each obtained transistor there was applied a gate voltage $V_G$ of +40 to −40 V and a source-drain voltage $V_{SD}$ of −40 V in a nitrogen atmosphere, using a silicon substrate 201 as the gate electrode, and upon measurement of the transistor characteristics, the mobility was calculated from the I-V characteristic. The obtained results are shown in Table 3 together with the film thickness of the active layer 220 in the transistor of each example.

TABLE 3

| | Film thickness (nm) | Mobility (cm$^2$/Vs) |
|---|---|---|
| Example 6 | 10 | $2.6 \times 10^{-5}$ |
| Example 7 | 21 | $5.9 \times 10^{-4}$ |
| Example 8 | 36 | $1.1 \times 10^{-3}$ |
| Example 9 | 47 | $1.3 \times 10^{-3}$ |
| Example 10 | 151 | $1.5 \times 10^{-3}$ |
| Example 11 | 258 | $2.2 \times 10^{-3}$ |

As shown in Table 3, it was confirmed that a larger active layer film thickness resulted in higher mobility.

The above results confirmed that orienting the semiconductor film and attaching the semiconductor film to its adjacent layer with heating and/or pressing yields a transistor with high carrier mobility and excellent transistor characteristics.

The invention claimed is:

1. A process for production of a transistor with an active layer composed of an organic semiconductor compound-containing semiconductor film, the process being characterized by including
   a step of stretching the semiconductor film and
   a step of pasting the stretched semiconductor film onto a surface on which the active layer is to be formed while heating and/or pressing, to obtain the active layer,
   wherein the semiconductor film is pasted onto the surface with a working liquid situated between them.

2. A process for production of a transistor provided with a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode, wherein the process includes
   a step of stretching the semiconductor film and
   a step of attaching the stretched semiconductor film to the insulating layer while heating and/or pressing to obtain the active layer,
   wherein the semiconductor film is attached to the insulating layer with a working liquid situated between them.

3. A transistor comprising an active layer composed of an organic semiconductor compound-containing semiconductor film,
   wherein the active layer is made of a stretched semiconductor film and is formed by pasting the semiconductor film onto a surface on which the active layer is to be formed while heating and/or pressing, and,
   wherein the active layer is formed by pasting the semiconductor film onto the surface with a working liquid situated between them.

4. A transistor according to claim 3, wherein the surface on which the active layer is to be formed is a surface of an insulating layer, a source electrode, an another active layer or a substrate.

5. A transistor provided with a source electrode and drain electrode, an active layer comprising an organic semiconductor compound-containing semiconductor film as a current channel between the electrodes, a gate electrode that controls the current flowing through the current channel and an insulating layer disposed between the active layer and gate electrode,
   wherein the active layer comprises the stretched semiconductor film and is formed pasting the semiconductor film onto the insulating layer while heating and/or pressing, and,
   wherein the active layer is formed by attaching the semiconductor film onto the insulating layer with a working liquid situated between it and the insulating layer.

* * * * *